(12) United States Patent
Keerthi et al.

(10) Patent No.: US 8,229,027 B2
(45) Date of Patent: Jul. 24, 2012

(54) PRE-DISTORTION AND MEMORY COMPENSATION APPARATUS

(75) Inventors: Arvind Keerthi, Bangalore (IN); Madabusi Govindarajan, Bangalore (IN); P. Vijay Kumar, Bangalore (IN); John Choma, San Dimas, CA (US); Abhijit Shanbhag, Sunnyvale, CA (US)

(73) Assignee: Scintera Networks, Inc., Sunnyvale, CA (US)

(*) Notice: Subject to any disclaimer, the term of this patent is extended or adjusted under 35 U.S.C. 154(b) by 0 days.

(21) Appl. No.: 12/909,649

(22) Filed: Oct. 21, 2010

(65) Prior Publication Data
US 2011/0032033 A1 Feb. 10, 2011

Related U.S. Application Data

(63) Continuation of application No. 11/484,008, filed on Jul. 7, 2006, now Pat. No. 7,844,014.

(51) Int. Cl.
*H04K 1/02* (2006.01)
*H04L 25/03* (2006.01)
*H04L 25/49* (2006.01)

(52) U.S. Cl. ........................... 375/296; 375/285

(58) Field of Classification Search .......... 375/285, 375/296, 297
See application file for complete search history.

(56) References Cited

U.S. PATENT DOCUMENTS

| | | | |
|---|---|---|---|
| 6,029,285 A * | 2/2000 | Belcher et al. | 330/149 |
| 6,275,685 B1 * | 8/2001 | Wessel et al. | 455/126 |
| 6,298,096 B1 | 10/2001 | Burgin | |
| 6,489,846 B2 | 12/2002 | Hatsugai | |
| 6,928,122 B2 * | 8/2005 | Opas et al. | 375/296 |
| 7,286,613 B2 | 10/2007 | Baron et al. | |
| 7,313,199 B2 | 12/2007 | Gupta et al. | |
| 7,372,918 B2 | 5/2008 | Muller et al. | |
| 7,555,058 B2 | 6/2009 | Hori et al. | |
| 7,558,332 B2 * | 7/2009 | Rashev et al. | 375/296 |
| 7,561,856 B2 | 7/2009 | Watabe et al. | |
| 7,577,211 B2 | 8/2009 | Braithwaite | |
| 7,583,754 B2 | 9/2009 | Liu | |
| 7,620,373 B2 | 11/2009 | Cole et al. | |
| 2001/0005402 A1 | 6/2001 | Nagatani et al. | |
| 2002/0186783 A1 * | 12/2002 | Opas et al. | 375/297 |
| 2003/0235295 A1 | 12/2003 | He et al. | |
| 2004/0008803 A1 | 1/2004 | Aldrovandi et al. | |
| 2005/0024138 A1 | 2/2005 | White et al. | |
| 2005/0099230 A1 | 5/2005 | Shanbhag | |

OTHER PUBLICATIONS

Notification of Transmittal of the International Search Report in corresponding International Application No. PCT/US07/72957 dated May 1, 2008, 1 p.

International Search Report in corresponding International Application No. PCT/US07/72957 dated May 1, 2008, 3 pp.

Written Opinion of the International Searching Authority in corresponding International Application No. PCT/US07/72957 dated May 1, 2008, 6 pp.

* cited by examiner

*Primary Examiner* — Jean B Corrielus
(74) *Attorney, Agent, or Firm* — Edward C. Kwok; Haynes and Boone, LLP

(57) ABSTRACT

Pre-distortion and memory compensation apparatuses and methods for a non-linear component are provided. The apparatus comprises an adaptive block for generating a plurality of correlation coefficients, which are used to weight a plurality of synthesis work functions to pre-distort a given signal. The adaptive block can be driven by an error signal generated from a feedback signal from the non-linear component output signal and a delayed version of the input signal. The apparatus is capable of being operated directly at radio frequency. Also provided are apparatuses and methods for generation of quadrature signals, transconductance amplification employing negative resistance, variable-gain amplification, and envelope detection.

18 Claims, 22 Drawing Sheets

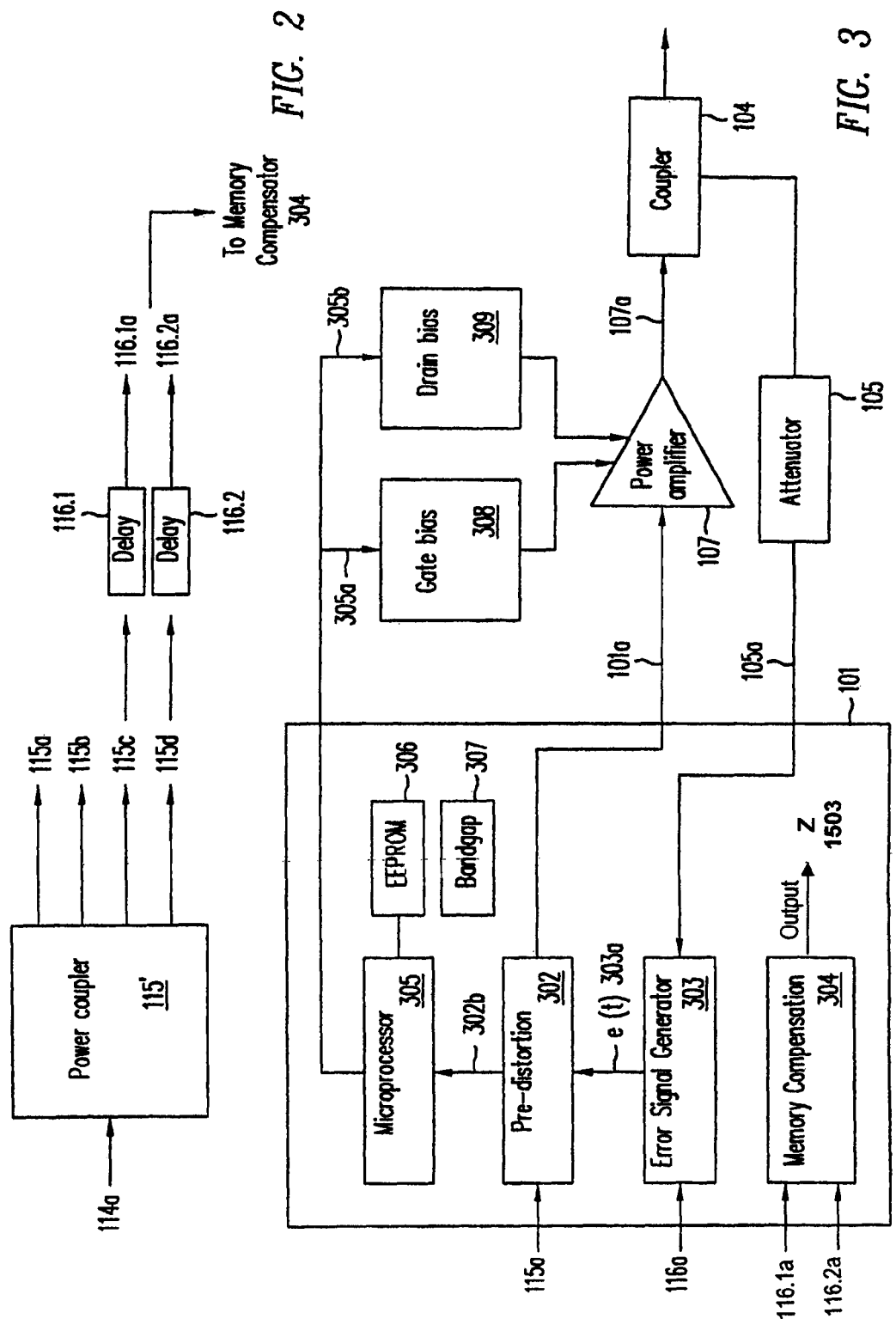

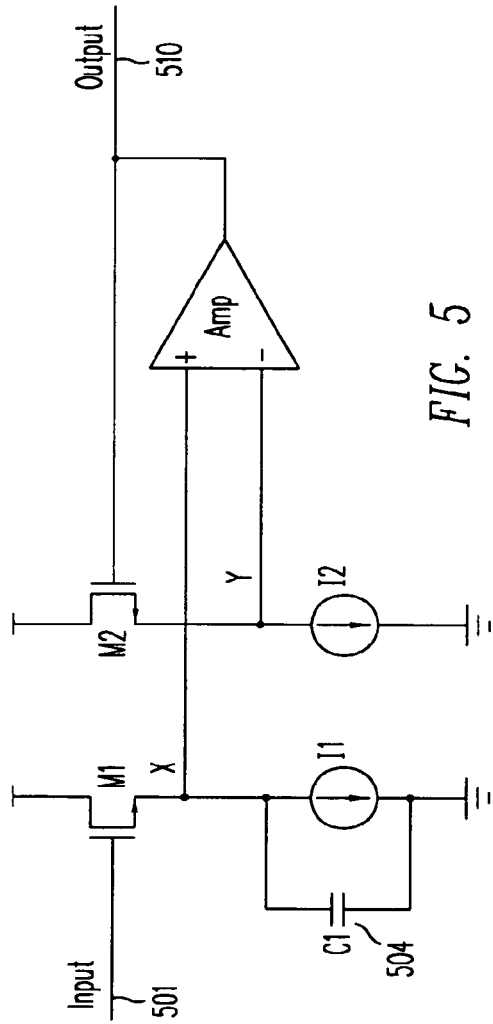
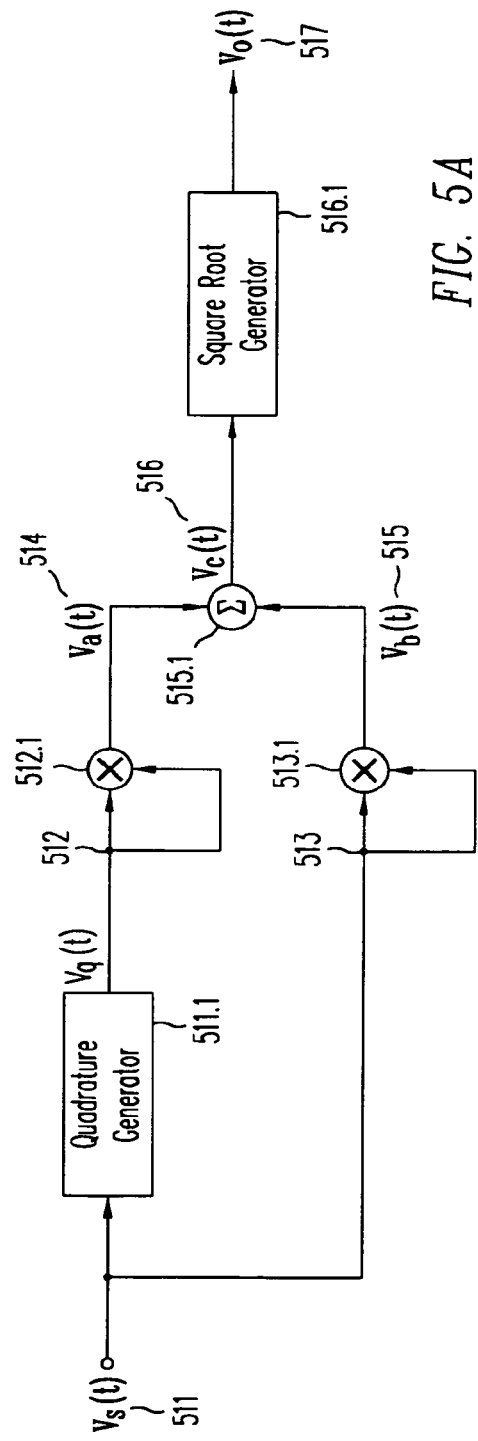
FIG. 5
FIG. 5A

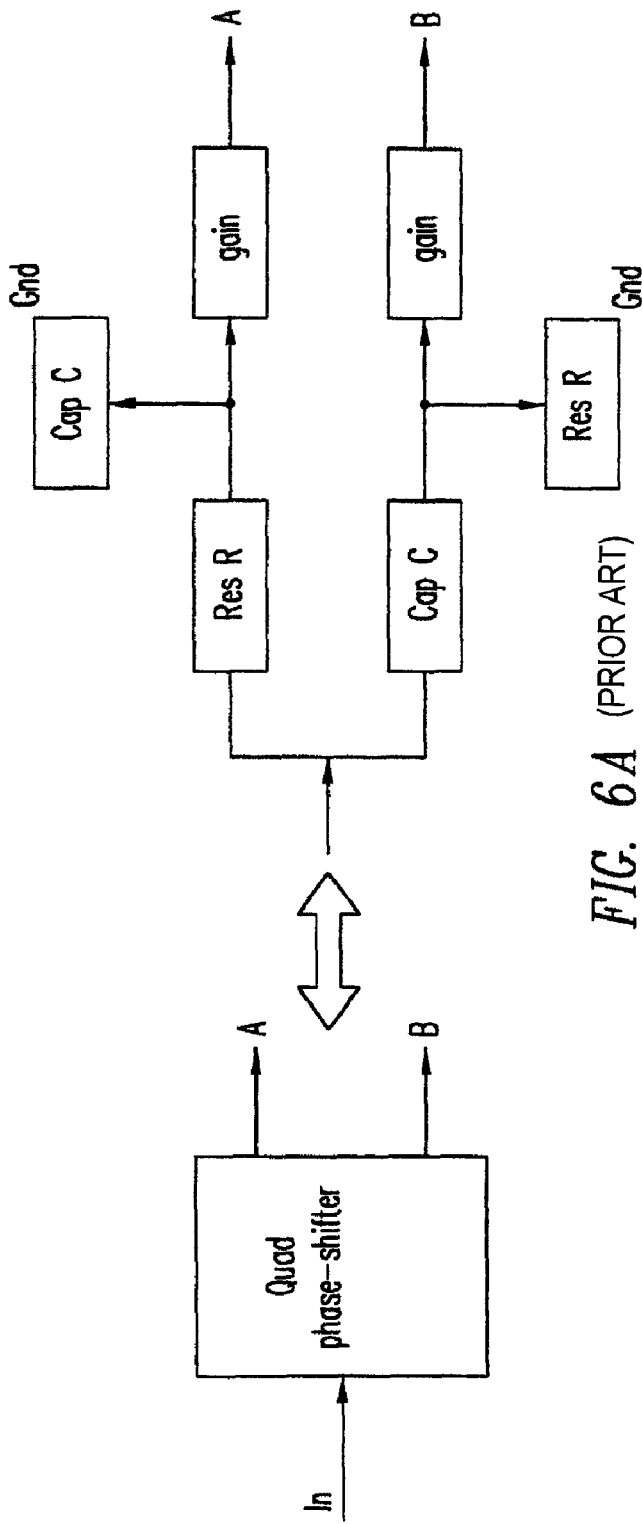
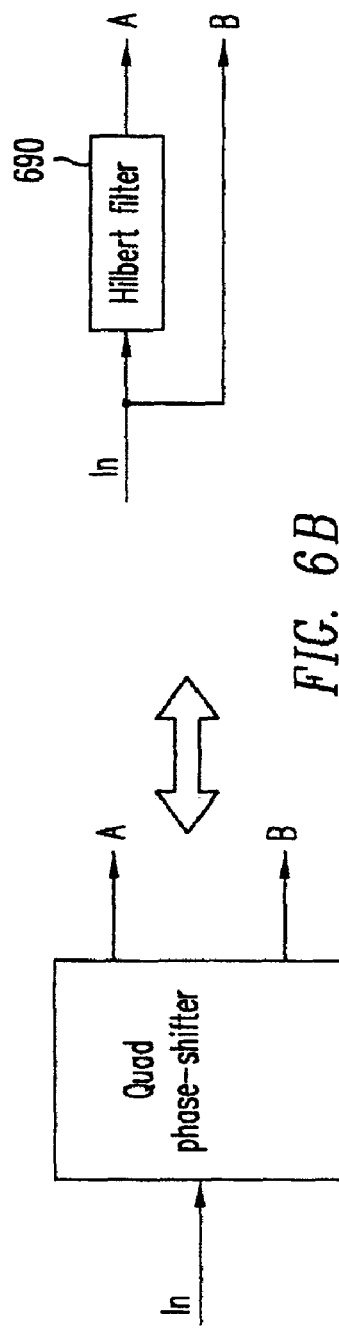
FIG. 6A (PRIOR ART)
FIG. 6B

| Coefficient | Value |
|---|---|
| w40 | 3.16 |
| w41 | −24.5 |
| w42 | 119.6 |
| w43 | 440 |
| w31 | 20.9 |
| w32 | −215.4 |
| w33 | 1256.1 |
| w22 | 100.7 |
| w23 | −1231.4 |
| w13 | 408.8 |

PRE-DISTORTION AND MEMORY COMPENSATION APPARATUS

REFERENCE TO RELATED APPLICATIONS

This application is a continuation of U.S. patent application Ser. No. 11/484,008, entitled "Pre-Distortion Apparatus," filed on Jul. 7, 2006, now U.S. Pat. No. 7,844,014; the disclosure of the Application is hereby incorporated by reference in its entirety.

FIELD OF THE INVENTION

This invention relates to a pre-distortion apparatus for non-linear components, which can be used as a linearizer for a radio-frequency (RF) power amplifier (PA), as well as various component circuitry and methods for implementing said pre-distortion apparatus.

BACKGROUND OF THE INVENTION

A communication system typically comprises multiple signaling nodes, such as user terminals, base stations, routers, switches, links, and so on. The nodes transmit and/or receive signals over a communication medium such as copper wire, optical fiber, or the atmosphere in the case of a radio interface.

In general, the signaling function requires some sort of signal amplification, since the amplitude of a signal is generally attenuated during transmission between nodes. For example, signals transmitted over a radio link may be attenuated due to such factors as propagation loss and multipath fading. A signal amplifier is thus typically provided to compensate for the attenuation.

In particular, a power amplifier (PA) is used to amplify a signal before transmission over a radio interface. When operated near saturation, PA's behave nonlinearly, leading to unwanted distortion of the signal. Such distortion can include so-called amplitude-amplitude (AM-AM) distortion and amplitude-phase (AM-PM) distortion.

To suppress unwanted PA nonlinearity, techniques such as using a pre-distorter have been investigated. A pre-distorter, disposed before a PA in the signal path, acts on an input signal in such a way that the combined effect of the pre-distorter and the PA is linear and memoryless. The advantages of using a pre-distorter include reducing spurious emissions, as well as improving power efficiency and in-band signal processing accuracy.

Various pre-distortion techniques have been described in the prior art. Look-up table based digital pre-distortion entails measuring the non-linear characteristics of a PA and storing a "mirror image" of those characteristics in a look-up table. Alternatively, such "minor image" characteristics may be pre-programmed into pre-distortion components operating directly at RF in a technique called "analog feed-forward." Yet another pre-distortion technique is polynomial-based digital pre-distortion, which entails digitally pre-distorting a signal at baseband using polynomial basis functions. With appropriate feedback, time-varying PA characteristics can be optimally adjusted using the latter approach.

The present disclosure describes various novel apparatuses and methods for linearizing non-linear output signals that may be used either in conjunction with or to the exclusion of the prior art techniques described above.

SUMMARY OF THE INVENTION

The present disclosure describes novel apparatuses and methods for linearizing the output signal of non-linear components such as RF power amplifiers, as well as various component circuitry for implementing said apparatuses and methods.

One aspect of the invention provides a pre-distortion apparatus comprising: a datapath signal, a reference signal, and a feedback signal; an error signal generator comprising a difference amplifier, wherein the input signals to said difference amplifier comprise: 1) a first amplifier input signal derived from the reference signal, and 2) a second amplifier input signal derived from the feedback signal, and wherein the output signal of said amplifier comprises an error signal; an adaptive block comprising: an analysis basis function generator for generating a plurality of analysis basis functions; a plurality of correlators for correlating the error signal with each of said plurality of analysis basis functions, the output signals of the plurality of correlators comprising a plurality of correlation coefficients; a synthesis block comprising: a synthesis work function generator for generating a plurality of synthesis work functions; a synthesizer for generating a weighted sum of said plurality of synthesis work functions, wherein each synthesis work function is weighted by a corresponding one of said plurality of correlation coefficients; a multiplier for multiplying said datapath signal with said weighted sum of said plurality of synthesis work functions. Also provided are various methods and means for achieving said pre-distortion.

A further aspect of the invention provides a memory compensation apparatus comprising: a system datapath signal, a system reference signal, a system pre-distorted output signal, and a system feedback signal; a first pre-distorter comprising a pre-distortion apparatus, a datapath signal of the pre-distorter comprising the system datapath signal, a reference signal of the pre-distorter comprising the system reference signal, a pre-distorted output signal of the pre-distorter comprising a first output signal, and a feedback signal of the pre-distorter comprising the system feedback signal; a first memory delay block for delaying the system datapath signal by a memory delay, the output signal of the memory delay block comprising a first memory delay block output signal; a first component delay block for delaying the first memory delay block output signal, the output signal of the component delay block comprising a first component delay block output signal; a first delay pre-distorter comprising a pre-distortion apparatus, a datapath signal of the delay pre-distorter comprising the first memory delay block output signal, a reference signal of the delay pre-distorter comprising the first component delay block output signal, a pre-distorted output signal of the delay pre-distorter comprising a first delay pre-distorter output signal, and a feedback signal of the delay pre-distorter comprising the system feedback signal; and a memory compensation adder for adding the first output signal to the first delay pre-distorter output signal, the output signal of the memory compensation adder comprising a summer output signal, wherein the system pre-distorted output signal comprises the summer output signal.

Yet a further aspect of the invention provides a pre-distortion method comprising: providing a datapath signal, a reference signal, and a feedback signal; amplifying the difference between two input signals to generate an error signal, said two input signals comprising: 1) a first input signal derived from the reference signal, and 2) a second input signal derived from the feedback signal; generating a plurality of analysis basis functions, and correlating the error signal with each analysis basis function to generate a plurality of correlation coefficients; generating a plurality of synthesis work functions, and generating a weighted sum of a plurality of synthesis work functions, by weighting each synthesis work function with a corresponding correlation coefficient; and multiplying the weighted sum of synthesis work functions with the datapath signal.

Also provided are various means and methods for envelope detection.

BRIEF DESCRIPTION OF FIGURES

FIG. 2 shows a power coupler for use with a memory compensator aspect of the pre-distorter.

FIG. 3 shows an overview of the internal system architecture of an embodiment of the RFPAL 101 shown in FIG. 1.

FIGS. 5, 5A, 5C, and 5D show preferred embodiments of the envelope detectors 408 and 413 shown in FIG. 4.

FIG. 6A shows an RC-CR implementation of the quadrature phase generator.

FIG. 6B shows a phase-shifter implemented using a Hilbert transformer.

DETAILED DESCRIPTION

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Denote the input signal to a non-linear component (NLC) by a signal s(t), which can be expressed as:

$$s(t)=r(t)\cos(\omega_c t+p(t)),$$

where r(t) represents the time-dependent amplitude (whose absolute value corresponds to the envelope) of the input signal, $\omega_c$ is the carrier frequency in radians, and p(t) represents a time-dependent phase term. In the absence of a pre-distorter, the NLC will generally introduce AM-AM (amplitude-to-amplitude) and AM-PM (amplitude-to-phase) non-linear distortion to this signal as follows:

$$NLC(s(t))=G[r(t)]\cos(\omega_c t+p(t)+B[r(t)]),$$

where G represents the AM-AM distortion, and B represents the AM-PM distortion.

To correct this non-linearity, the signal s(t) can be first processed to generate a pre-distorted signal y(t) given by:

$$y(t) = \sum_{i=1}^{N} p_i r^i \cos(\omega_c t + p(t)) + \sum_{i=1}^{N} q_i r^i \sin(\omega_c t + p(t))$$

where $p_i$ and $q_i$ represent coefficients for weighting each basis function $r^i \cos(\omega_c t+p(t))$ and $r^i \sin(\omega_c t+p(t))$, respectively. (Note that for simplicity of notation, the time dependence of r has been omitted from the preceding equation.) The pre-distorter output signal y(t) can then be input to the NLC to produce:

$$NLC(y(t))=G'[r(t)]\cos(\omega_c t+p(t)+B'[r(t)]) \quad \text{(Eq. 1)}$$

where G' and B' represent the composite AM-AM and AM-PM distortion, respectively, of the combination of the pre-distorter and NLC. In designing a pre-distorter, then, it is seen that the coefficients $p_i$ and $q_i$ should be chosen such that the composite functions G' and B' introduce as little non-linear distortion as possible to the signal s(t).

Figure 1:
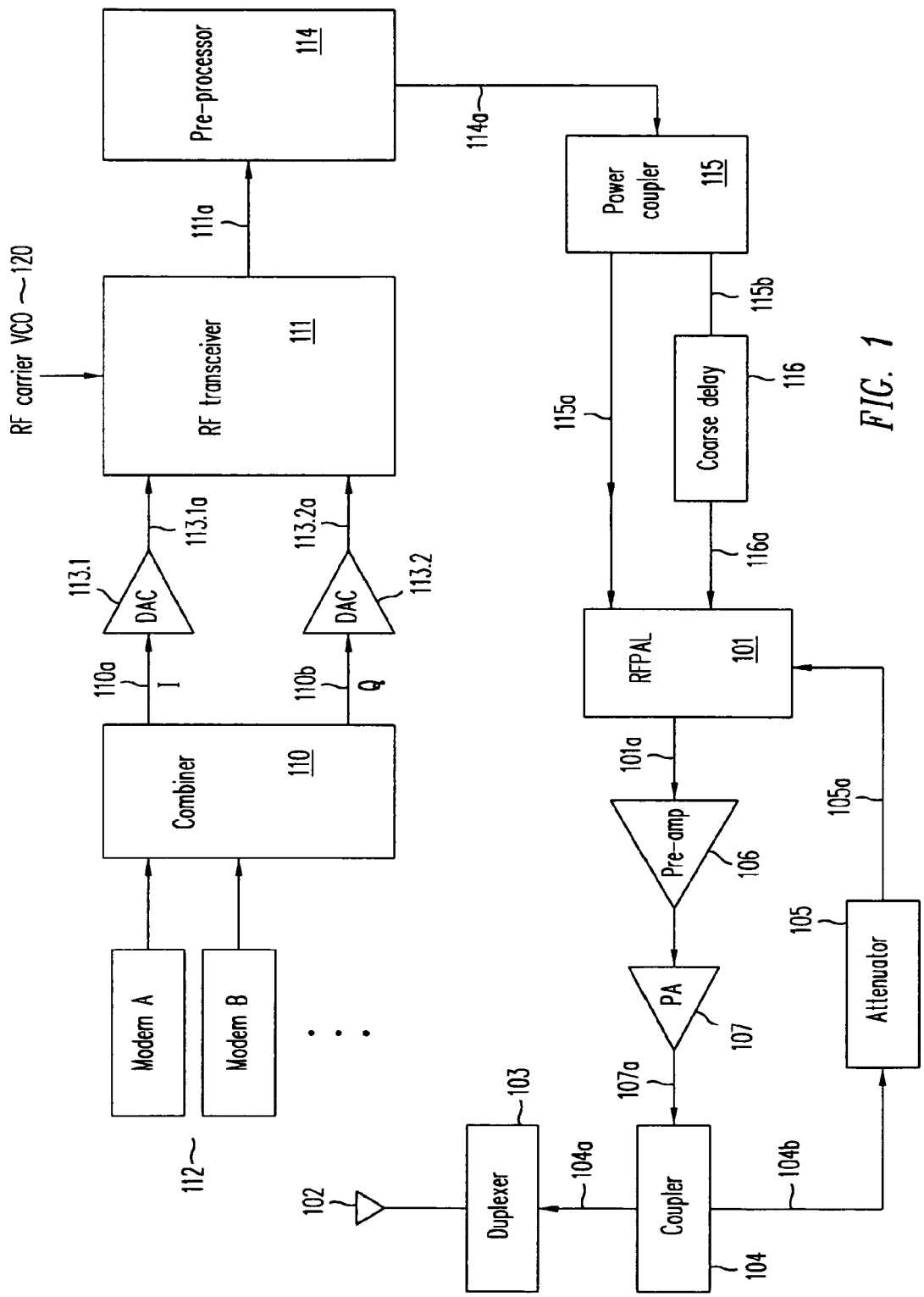
FIG. 1 shows a specific embodiment of the pre-distorter in a power amplifier in a radio transmitter.

Turning now to a specific embodiment, FIG. 1 shows a pre-distorter for a power amplifier in a radio transmitter. One of ordinary skill in the art will recognize that the pre-distorter need not be applied as shown in FIG. 1, but may be used in conjunction with any NLC to improve the distortion characteristics of the NLC output signal. In particular, the pre-distorter can operate at baseband, intermediate frequency (IF), or radio frequency (RF). The pre-distorter can be used not only in base station transceivers as shown in FIG. 1, but in mobile and other types of transmitters or receivers (e.g., to linearize the output signal of a low-noise amplifier (LNA) or mixer in the receive chain). Illustrative embodiments of such alternative applications will be described later with reference to FIGS. 16A and 16B.

In FIG. 1, a baseband combiner 110 can digitally combine the signals from a series of digital modems 112. The combiner 110 can output an in-phase signal (I) 110a and a quadrature-phase signal (Q) 110b which can be converted into analog signals by the DACs 113.1 and 113.2. The analog I and Q output signals 113.1a and 113.2a can then be input to an RF transceiver 111 which modulates the I and Q signals onto an RF carrier frequency $f_c$, by multiplying the I and Q signals with a carrier signal generated by a VCO 120. The output signal 111a of the RF transceiver 111 can be further processed by the pre-processor block 114, which may perform such operations as filtering and pre-amplification of the signal 111a.

The output signal 114a of the pre-processor block 114 can be input to a power coupler 115, which splits an input signal into multiple output signals. In one embodiment, the power coupler 115 splits the output signal 114a of the pre-processor block 114 into two output signals 115a and 115b, as shown in FIG. 1. In the preferred embodiment, the signal 114a may be of power 3 dBm, and signals 115a and 115b can be 0 dBm each. The output signal 115a may be input directly to the Radio Frequency Power Amplifier Linearizer (RFPAL) block 101, and may serve as the datapath signal to be pre-distorted according to the algorithms described herein. The other output signal 115b may be input to a coarse delay block 116, which can delay a signal 115b by a pre-determined time period, and then be input to the RFPAL 101 as the delayed signal 116a.

The delay of the coarse delay block 116 may be chosen to approximate the delay of the Power Amplifier 107. In one embodiment, the Power Amplifier 107 is a 6S21140 LDMOS RF power field effect transistor (FET), available from Freescale Semiconductor, and the coarse delay block 116 delays the signal 115b by about 5.9 ns. One of ordinary skill in the art will realize that the coarse delay block 116 may be a stand-alone component delay block, or an incorporated component delay block of the RFPAL integrated circuit (IC). Note that in one embodiment, a delay-locked loop (DLL) may also be incorporated in the RFPAL 101 to further adjust the relative delay between the power amplifier output signal 107a and the reference signal 116a. One of ordinary skill in the art will also recognize that the coarse delay block 116 may even be omitted if any resulting degradation in performance is deemed tolerable, eg, if the delay of the PA 107 is negligible.

In an alternative embodiment of the pre-distorter, the power coupler 115 can split the output signal 114a of the pre-processor block 114 into four output signals 115a, 115b, 115c, and 115d, as shown in FIG. 2. In this embodiment, output signals 115c and 115d may be input to memory delay blocks 116.1 and 116.2, respectively, and then input to the RFPAL 101 as signals 116.1a and 116.2a. Memory delay block signals 116.1a and 116.2a may be used in a memory compensator 304 in the RFPAL 101, to be described with reference to FIG. 3. The memory compensator 304 can generate pre-distorted versions of the signals 116.1a and 116.2a to correct distortion due to memory effects exhibited by the PA 107 by adding the pre-distorted versions of the signals to the distorted output signals (a memory compensator is also called a memory compensation summer). For this reason, the memory delay blocks 116.1 and 116.2 may be designed to introduce delays that approximate the PA memory delays. The internal architecture of the memory compensator 304 will be described later in the specification.

Referring back to FIG. 1, the RFPAL 101 may internally compare the delayed signal 116a to an attenuated version 105a of the RF power amplifier output signal 107a to generate an error signal for driving the adaptive pre-distortion algorithms of the RFPAL 101. The RFPAL 101 may output a pre-distorted signal 101a, which can be input to a pre-amplifier 106, and then to the power amplifier 107. The power amplifier output signal 107a can be input to a coupler 104, which splits the signal 107a into two signals 104a and 104b. The signal 104a can then be input to the duplexer 103, and be transmitted over the radio channel using the antenna 102. The signal 104b can be input to an attenuator 105 and fed back to the RFPAL 101 as signal 105a, as earlier described.

FIG. 3 shows an overview of the internal system architecture of an embodiment of the RFPAL 101 shown in FIG. 1. One of ordinary skill in the art will recognize that the labeled blocks show only conceptualized divisions of the sub-functions of the RFPAL. Alternative logical and physical divisions of the sub-functions of the RFPAL also fall within the scope of the pre-distortion apparatus. For example, the pre-distortion block 302 and error signal generator block 303 may be implemented as one composite physical block.

The RFPAL 101 from FIG. 1 is similarly labeled as 101 in FIG. 3. Signal 115a can serve as the datapath signal to be pre-distorted by the pre-distortion block 302. Signal 116a, a delayed version of signal 115b, is input to the error signal generator block 303. The signal 116a can be referred to as the reference signal. The error signal generator block 303 can also receive as input an attenuated version 105a of the power amplifier output signal 107a. The signal 105a can be referred to as the feedback signal. The error signal generator block 303 compares reference signal 116a to feedback signal 105a to generate an error signal e(t) 303a, which is used to drive the adaptive pre-distortion algorithm in the pre-distortion block 302. The output signal 101a of the pre-distortion block 302 can be input to the PA 107. The output signal 101a can be referred to as the (buffered) pre-distorted signal.

In one embodiment, signals 116.1a and 116.2a can be input to a memory compensation block 304.

The RFPAL 101 may also comprise a microprocessor 305, which executes code stored in an electrically erasable programmable read-only memory (EEPROM) 306. The microprocessor functions may comprise, for example, accepting a signal 302b from the pre-distortion block 302 indicative of the datapath signal 115a's signal strength, and outputting signals 305a and 305b to adjust the gate bias 308 and drain bias 309, respectively, of the power amplifier 107.

The RFPAL 300 may also comprise a bandgap voltage reference 307 to provide a reference voltage for the on-chip circuitry.

Figure 4:
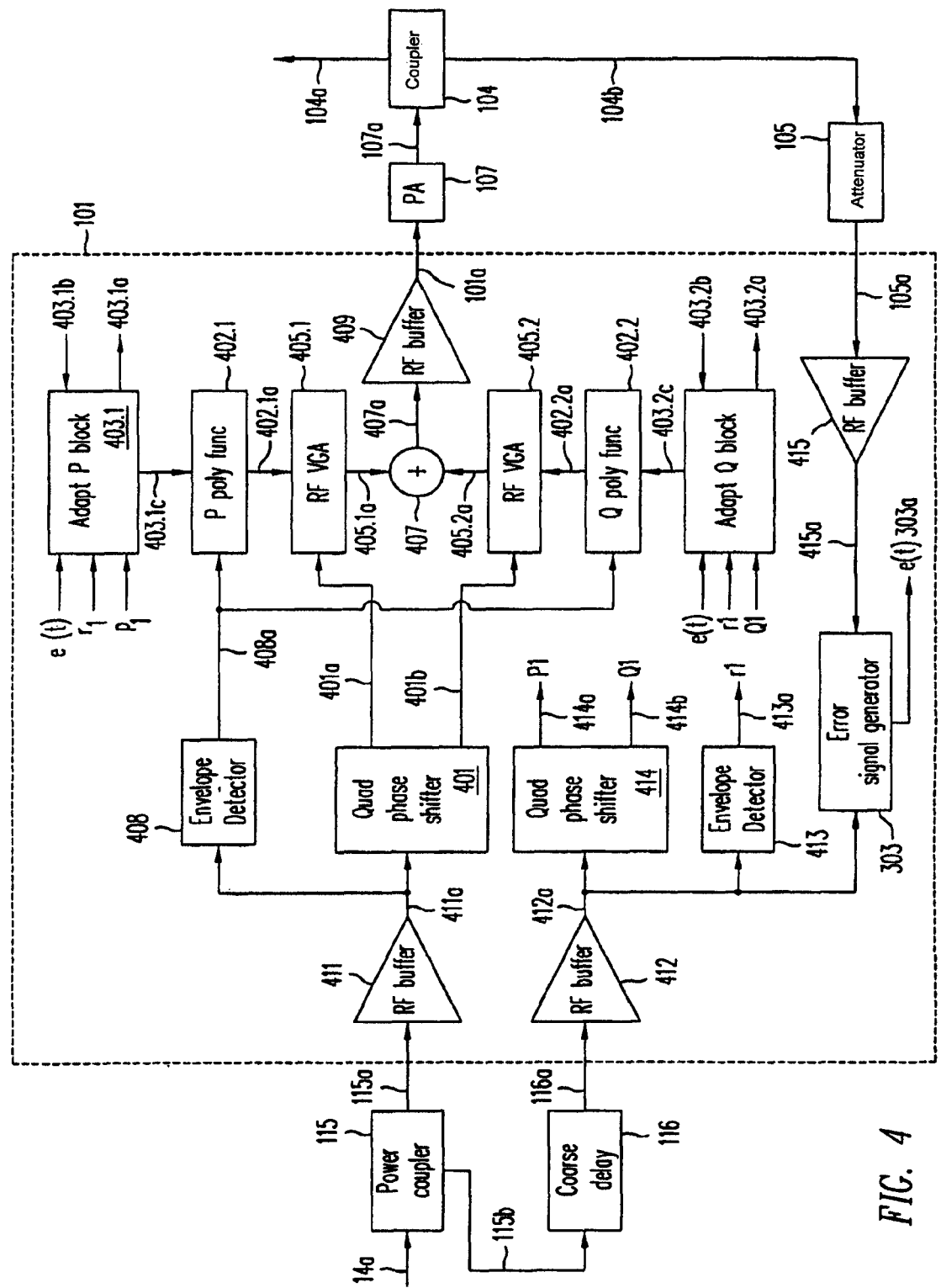
FIG. 4 shows the portion of the RFPAL 101 corresponding to the pre-distortion block 302 and error signal generator block 303 shown in FIG. 3.

FIG. 4 shows the portion of the RFPAL 101 corresponding to the pre-distortion block 302 and error signal generator block 303 shown in FIG. 3. A functional description of the blocks shown in FIG. 4 is now given, with an architectural description of the blocks to be given later in the specification. In the embodiment shown in FIG. 4, the datapath, reference, feedback, and pre-distorted signals are all real signals, i.e., signals having real amplitudes. One of ordinary skill in the art will recognize that the pre-distorter can also be described and implemented using complex signals, i.e., signals having both real and imaginary components.

As shown in FIG. 4, signal 115a from the power coupler 115 in FIG. 3 is input to an RF buffer 411, which outputs a buffered signal 411a. Signal 411a is then input to a 0/90-degree quad phase generator 401. The phase generator 401 outputs a 0-degree phase-shifted (in-phase, or "I") version of signal 411a as signal 401a, and a 90-degree phase shifted (quadrature-phase, or "Q") version of signal 411a as signal 401b. Note hereinafter, with respect to FIG. 4, components specific to the in-phase (I) processing path will be denoted by a 0.1 appended to the block number, and components specific to the quadrature-phase (Q) processing path will be denoted by a 0.2 appended to the block number. For example, 402.1 denotes the work function generator for the I path, while 402.2 denotes the work function generator for the Q path. As the processing of the in-phase signal can be identical to the processing of the quadrature-phase signal, and the components used for the I path can be identical to those used for the Q path, only the processing of the I signal will be described herein for simplicity.

The buffered signal 411a is also input to an envelope detector 408, which removes the RF component of the signal as well as the sign of the amplitude, and thus outputs a datapath envelope signal 408a that tracks the envelope of the buffered datapath signal 411a. The envelope signal 408a is input to the P polynomial function synthesizer block 402.1. From the datapath envelope signal 408a, the P poly func block 402.1 can generate a set of synthesis work functions. These work functions may be weighted by the coefficients 403.1c supplied by the Adapt P block 403.1. The weighted work functions may be summed to give a synthesized function 402.1a. Block 402.1 may also be referred to as a synthesizing function generator.

The synthesized function 402.1a is used by the RF variable-gain amplifier (VGA) 405.1 to modulate the gain of the I signal 401a, resulting in the pre-distorted I signal 405.1a. The RF VGA 405.1 thus effectively multiplies the synthesized function 402.1a with the I signal 401a.

Signal 405.1a can then be summed with signal 405.2a, generated by a corresponding set of Q-phase components (ie, 403.2, 402.2, and 405.2), by the RF summer 407. The RF summer output signal 407a, which is referred to as the unbuffered pre-distorted signal, can be buffered by RF buffer 409 to produce a buffered pre-distorted signal 101a. In one embodiment of the RFPAL, the buffered signal 101a may be directly output to the off-chip power amplifier 107. In an alternative embodiment, the output signal 101a may first be input to an automatic gain control (AGC) circuit (not shown), whose gain may depend on the detected envelope of the power amplifier output signal 107a. The AGC output signal may then be supplied to the PA 107. This feature can be used to correct for any variations in the gain of the PA 107 that might be caused by, for example, variations in the supply or bias voltages of the PA 107.

As noted earlier, the Adapt P block 403.1 supplies the set of adaptive coefficients 403.1c to the P polynomial function synthesizer block 402.1. The adaptive coefficients 403.1a may be computed according to an adaptive algorithm designed to minimize the error difference 303a, or e(t), between signal 116a and a scaled, buffered version 415a of the PA output signal 107a. In particular, the adaptive coefficients 403.1c may comprise an optimal set of weights for weighting a chosen set of work functions. Embodiments of the adaptive algorithm, as well as preferred choices of basis functions, will be described in detail later in this specification.

To drive the adaptive algorithm, the Adapt P block 403.1 may accept as input signals the reference envelope signal 413a of the buffered reference signal 412a, the in-phase component 414a of the buffered reference signal 412a, and the error signal 303a or e(t) generated by the error signal generator block 303. The Adapt P block 403.1 may also accept configuration parameters 403.1b, such as the weights used to construct the basis functions from a set of monomial functions, from the Microprocessor 305 shown in FIG. 3. The Adapt P block 403.1 may provide a signal 403.1a, which may include the adaptive coefficients $p_i$ and $q_i$ (later discussed with reference to the Adapt P block and Adapt Q block in FIG. 10), to the Microprocessor 305.

In a preferred embodiment, the Adapt P block 403.1 may be configurable such that the correlation coefficients are "frozen," i.e., not updated, in response to an indication that the power of the pre-distorted signal exceeds a pre-determined threshold. In one implementation, this can be done by selectively setting $\mu=0$ during those times when said indication is present. Unfreezing can then be achieved by setting $\mu$ to the value it had prior to its being set to 0. In an alternative embodiment, the signal 1003a can be saturated if it exceeds a certain threshold value.

Note the components labeled "RF" in FIG. 4, and described as "RF" in this specification, refer to RF signals in an embodiment wherein the pre-distorter is applied to an RF transmitter. In a preferred embodiment, the pre-distorter can be used to linearize RF signals by performing operations entirely at RF, thus providing a modular "drop-in" solution for non-linear RF components such as power amplifiers. However, one of ordinary skill in the art will recognize that the pre-distorter need not operate at RF. Rather, it can operate at any frequency, including IF or baseband, depending on the application. Such embodiments also fall within the scope of the pre-distortion apparatus.

Note also that the processing circuitry shown in FIG. 4 is split into a set of I components (denoted by suffix 0.1) and a set of Q components (denoted by suffix 0.2) for processing the I and Q signals, respectively, generated by quad phase generator 401. However, one of ordinary skill in the art will recognize that the same functionality described can be achieved using a single composite set of components for processing complex signals.

For example, it can be seen that the operations performed by the two VGA's 405.1 and 405.2 and the RF summer 407 essentially comprise two multiplications and one addition: one multiplication between the I signal 401a and the synthesized I function 402.1a, one multiplication between the Q signal 401b and the synthesized Q function 402.1b, and one addition between those two products. These operations can alternatively be described as taking the real part of the product of a complex multiplication, wherein the first complex multiplicand comprises a real part 401a and an imaginary part 401b, and the complex conjugate of the second complex multiplicand comprises a real part 402.1a and an imaginary part 402.1b. The real part of the product of such a complex multiplication will correspond to the signal 407a. Thus, the pre-distorter can be implemented and/or described using either real or complex functions and components, and both implementations fall within the scope of the disclosed pre-distortion apparatus.

The details of the individual blocks of the RFPAL shown in FIG. 4 will now be described.

Figure 7:
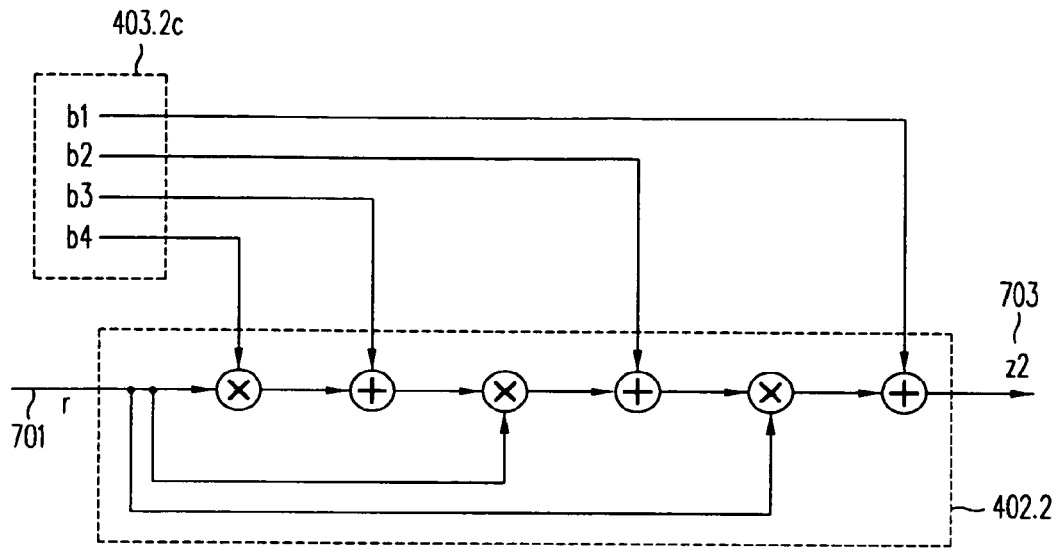
FIG. 7 shows an implementation of the Q polynomial function synthesizer 402.2 in FIG. 4.

FIG. 7 shows an implementation of the Q polynomial function synthesizer 402.2 in FIG. 4. The same implementation can be used in the P polynomial function synthesizer 402.1 in FIG. 4. The Q polynomial function synthesizer 402.2 can accept as one input signal the envelope signal 701 (which can correspond to signal 408a in FIG. 4), also denoted r in FIG. 7. The generator 402.2 can also input the coefficients 403.2c comprising signals $b_1$, $b_2$, $b_3$, and $b_4$, which are supplied by the Adapt Q block 403.2 in FIG. 4. The signals $b_1$, $b_2$, $b_3$, and $b_4$ represent the set of adaptive coefficients computed by the Adapt Q block 403.2. According to the operations shown in FIG. 7, the output signal 703 can be expressed as $b_4 r^3 + b_3 r^2 +$ $b_2r+b_1$. This output signal 703 can be referred to as the weighted sum of the synthesis work functions.

One of ordinary skill in the art will recognize that alternative architectures to the one shown in FIG. 7 may be used to generate basis polynomials from a set of monomials, including architectures employing Horner's method. Such alternative architectures are also within the scope of the pre-distortion apparatus.

Figure 10A:
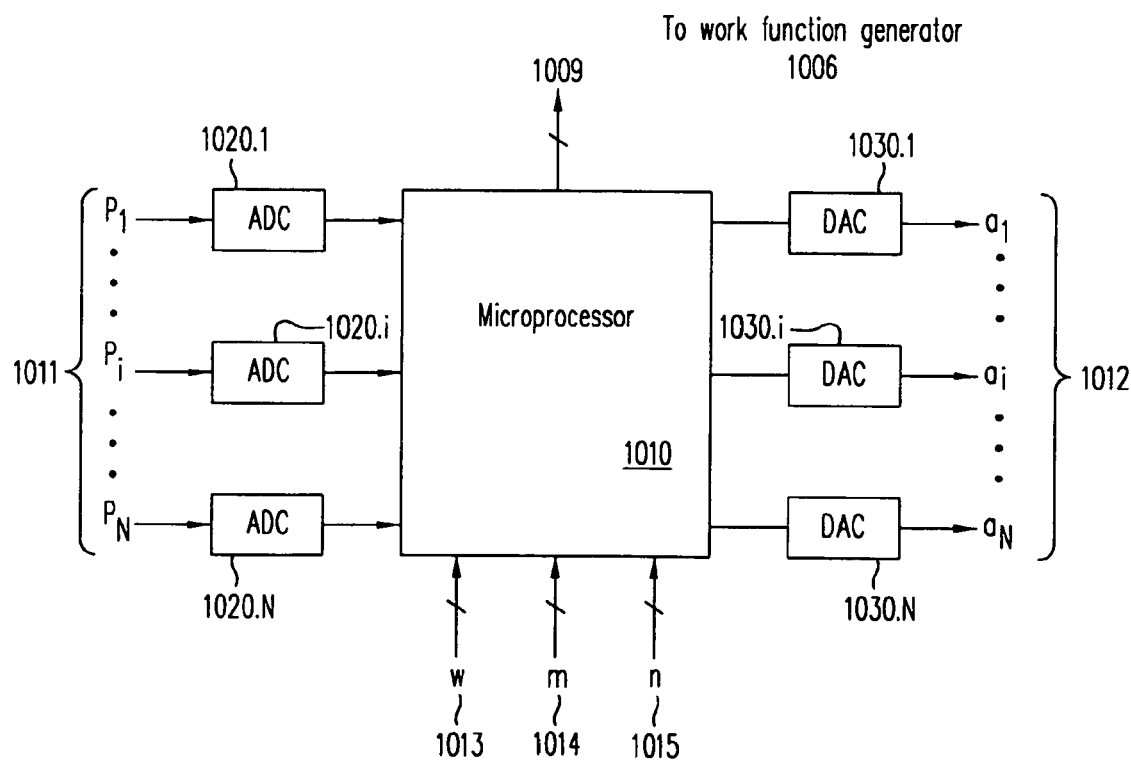
FIG. 10A shows some of the functionality of a microprocessor used in the pre-distorter.
Figure 10:
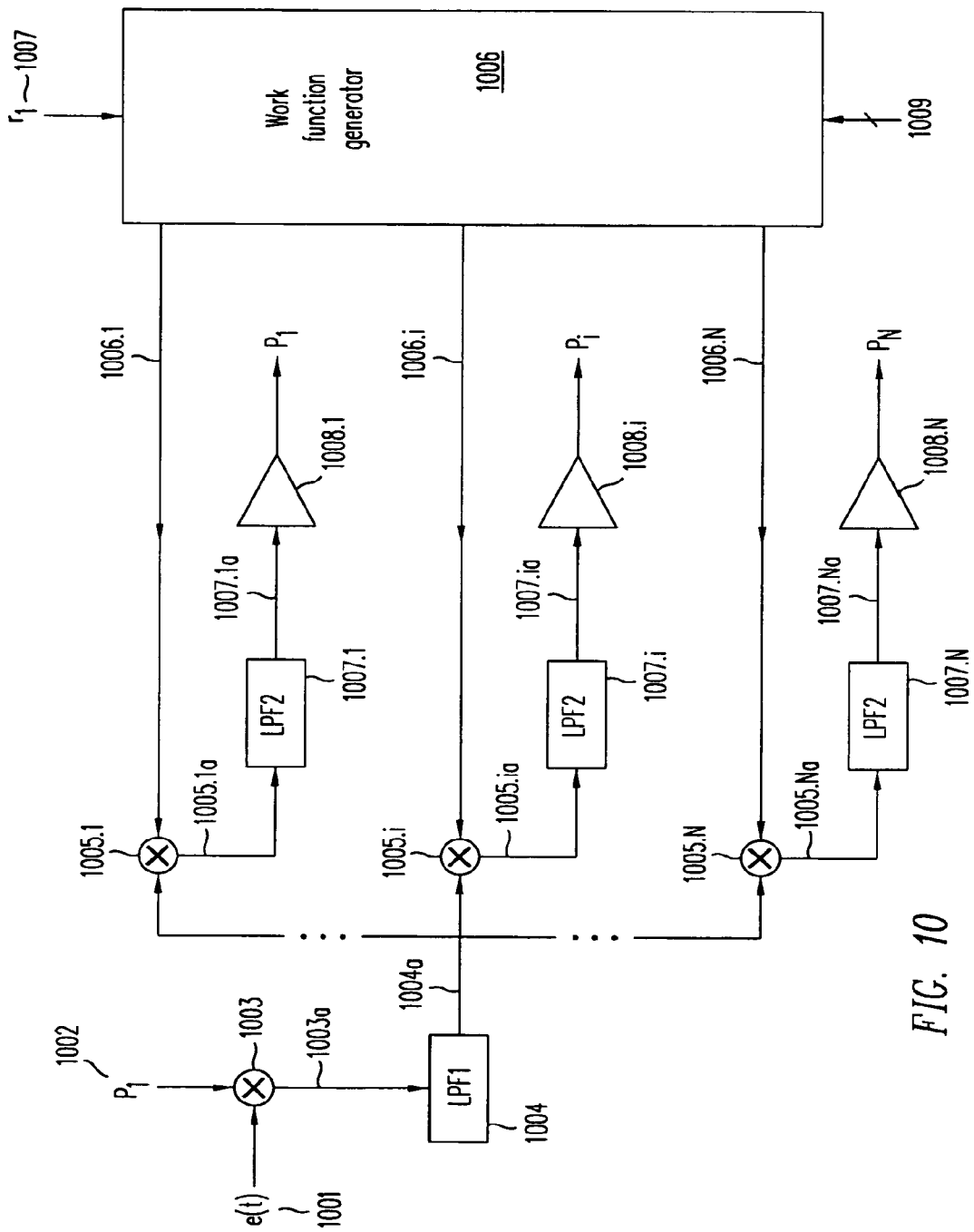
FIG. 10 shows an implementation of the Adapt P block 403.1.

FIG. 10 shows an implementation of the Adapt P block 403.1. The Adapt Q block 403.2 shown in FIG. 4 may be implemented in a similar manner. In one embodiment, the Adapt P and Adapt Q blocks may be implemented as one logical block with two instances of the circuitry shown in FIG. 10.

As described earlier, the Adapt P block 403.1 can accept as inputs an RF signal e(t) 1001, which can correspond to the error signal 303a generated by the error signal generator 303 in FIG. 4, and an RF signal P1 1002, which can correspond to the I component 414a of the reference signal 116a shown in FIG. 4. Furthermore, the Adapt P block 403.1 can accept as input a baseband signal r1 1007, which can correspond to the reference envelope signal 413a generated by the envelope detector 413 shown in FIG. 4. The Adapt P block 403.1 can also accept as parameter inputs a set of coefficients w, collectively labeled 1009, corresponding to the coefficients used to construct the work functions for the adaptive algorithm. These coefficients 1009 may be supplied by a microprocessor 1010, shown in FIG. 10A. After performing the adaptive algorithm, the Adapt P block 403.1 can output a set of coefficients $p_1, \ldots p_i, p_N$, labeled in FIG. 10, collectively denoted 1011 in FIG. 10A. These coefficients can be converted to digital form by the ADC's 1020.i, and then be inputted to the microprocessor 1010. The microprocessor 1010 can convert the coefficients 1011 to a set of monomial function coefficients 1012, which can then be input to the P poly function generator 402.1 as coefficients 403.1c shown in FIG. 4. Digital-to-analog converters (DAC's) 1030.i may be used to convert the digital signals from the microprocessor 1010 to analog signals.

Figure 11:
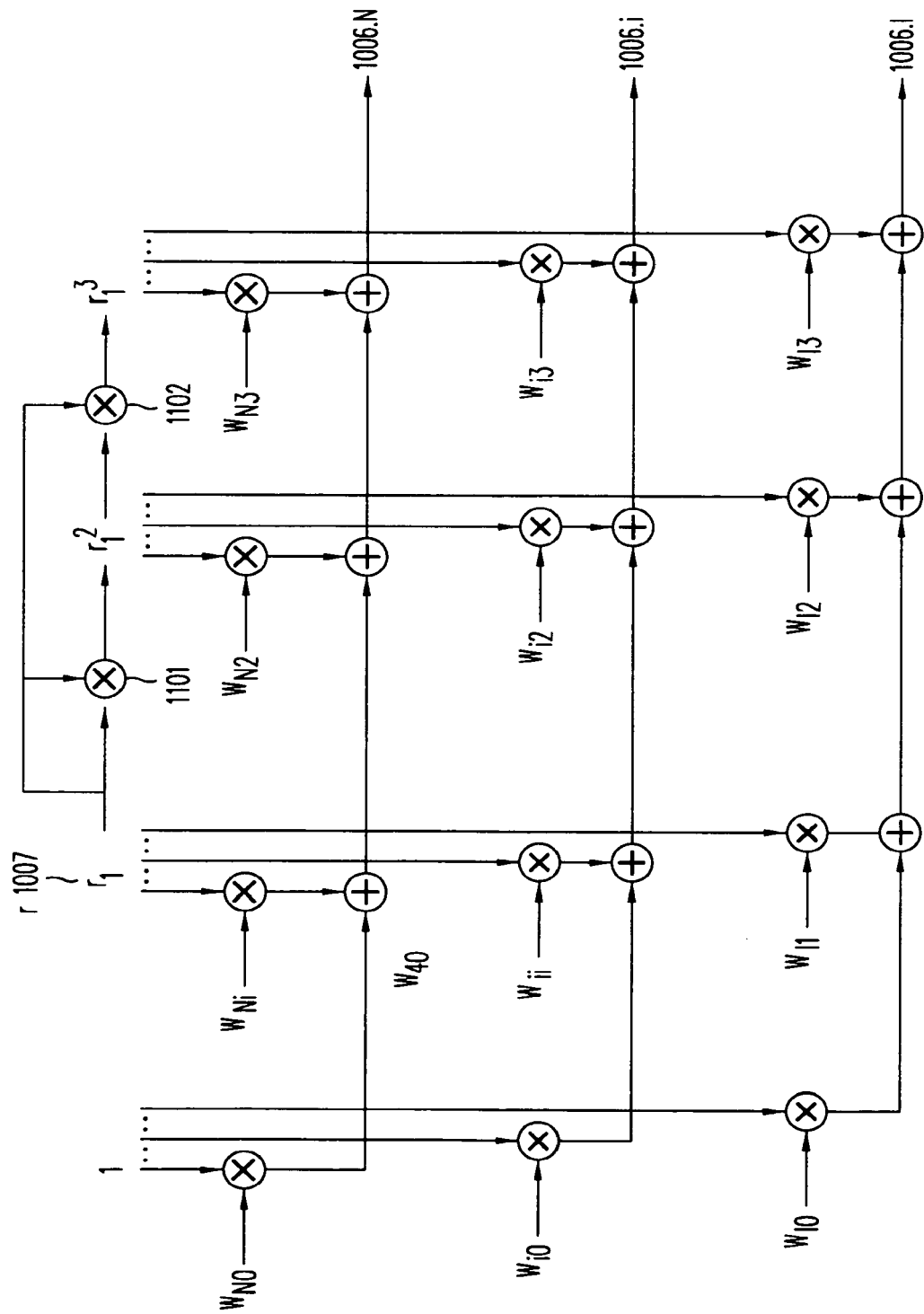
FIG. 11 shows one possible architecture of the work function generator 1006 in FIG. 10.

The architecture of the work function generator 1006 will now be described. The work function generator 1006 synthesizes a set of N analysis work functions 1006.1, ..., 1006.i., ..., 1006.N. Here, the variable i is an index (from 1 to N) to an arbitrary one of the N work functions. The embodiment shown in FIG. 11 depicts an embodiment wherein N=4. FIG. 11 depicts the work function generator 1006 inputting the reference envelope signal $r_1$ 1007, and generating raised powers $r_1^2, \ldots r_1^{N-1}$ of signal 1007 using multipliers 1101 and 1102 successively. In this specification and in the claims, a "raised power" of an envelope signal refers to a signal whose amplitude corresponds to the envelope signal's amplitude raised to an exponential power. For example, "the N raised powers of the reference envelope signal $r_1$" may refer to the signals $r_1^0$ (or 1), $r_1^1$ (or $r_1$), $r_1^2, \ldots, r_1^{N-1}$, with $r_1^0$ corresponding to a DC term, and $r_1^1$ corresponding to the original envelope signal $r_1$ 1007.

As shown in FIG. 11, the work function generator can weight (multiply) each raised power of the reference envelope signal by a coefficient $w_{ij}$ (where j indexes the raised power of the envelope signal, and ranges from 0 to N−1) and the weighted raised powers may be summed over j to produce a plurality of polynomial work functions 1006.i. Each work function 1006.i is thus seen to be a linear combination of raised powers of the reference envelope signal $r_1$ 1007.

In the embodiment shown in FIG. 11, there are N work functions generated from four raised powers of the reference envelope signal. One of ordinary skill in the art will recognize that the pre-distorter is not limited to only four raised powers of the envelope signal. The pre-distorter encompasses any number of raised powers of the envelope signal. Furthermore, the pre-distorter is not limited to only four work functions generated from four raised powers—the number of work functions N may be more than the number of raised powers, allowing for a set of dependent, rather than independent, vectors.

Figures 12, 13:
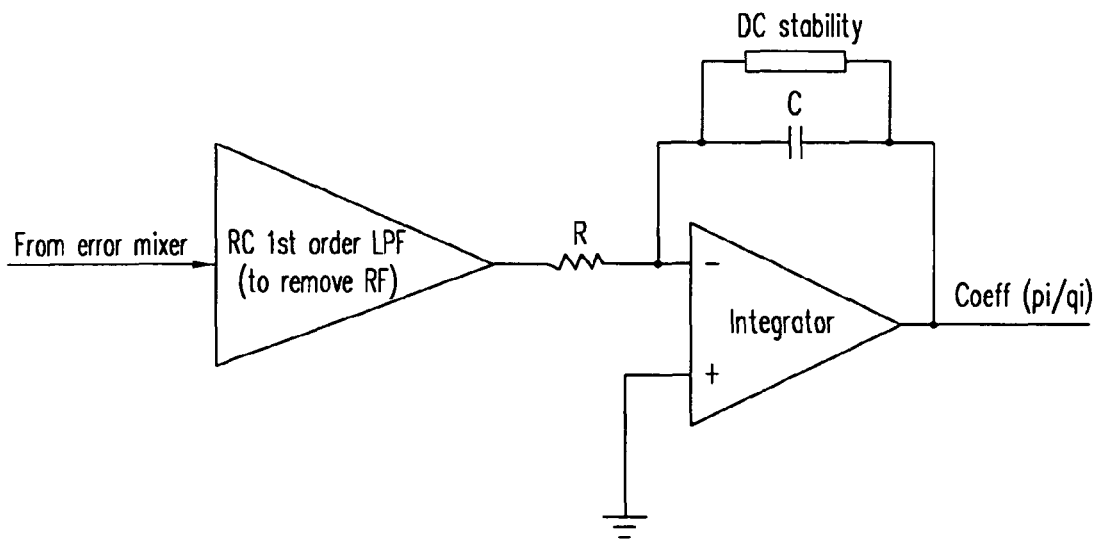
FIG. 12 shows a preferred set of weights w for each polynomial analysis work function $\Phi_i$, according to the notation defined in FIG. 11.
FIG. 13 shows a preferred embodiment of a low-pass filter for use in the Adapt P block shown in FIG. 10.

In a preferred embodiment, four work functions (i.e., N=4) are generated from four raised powers of the envelope signal, and each work function consists of one of the four monomials 1, $r_1$, $r_1^2$, $r_1^3$. In another preferred embodiment, four work functions $\Phi_i$ are generated from four raised powers of the reference envelope signals, each polynomial $\Phi_i$ comprising a weighted sum (i.e., a linear combination) of the monomials 1, $r_1, r_1^2, \ldots, r_1^{N-1}$. The RMS value of each work function can be set to 1 Volt in a preferred embodiment. A preferred set of weights w for each polynomial $\Phi_i$, chosen for the case where the power level of the signal input to the RFPAL is 0 dBm, is shown in FIG. 12, with the weights defined according to the work function generator shown in FIG. 11.

In general, the work functions may be chosen to be orthogonal to each other, and thus may be constructed according to procedures known to those of ordinary skill in the art, such as Gram-Schmidt orthogonalization or the Cholesky method.

In a preferred embodiment, the work functions may be chosen as follows to help speed up convergence of the adaptive algorithm. In particular, define a column vector $[1, r_1, r_1^2, r_1^3]^T$ as a monomial basis function vector. Define the expectation of the outer product of this vector (i.e., $E\{[1, r_1, r_1^2, r_1^3]^T \cdot [1, r_1, r_1^2, r_1^3]\}$) as the auto-correlation matrix. The work functions may be chosen to reduce the eigenvalue spread of this autocorrelation matrix. In practice, the autocorrelation matrix can be approximated by taking the long-term averages of the outer product of the monomial basis function vector. Note that according to this embodiment, the coefficients for both the analysis and synthesis work functions may be derived once and stored in memory for later use, or they may be continuously updated, eg, every 100 ms, to account for variations in the power level of the input to the RFPAL.

Figures 11A, 14:
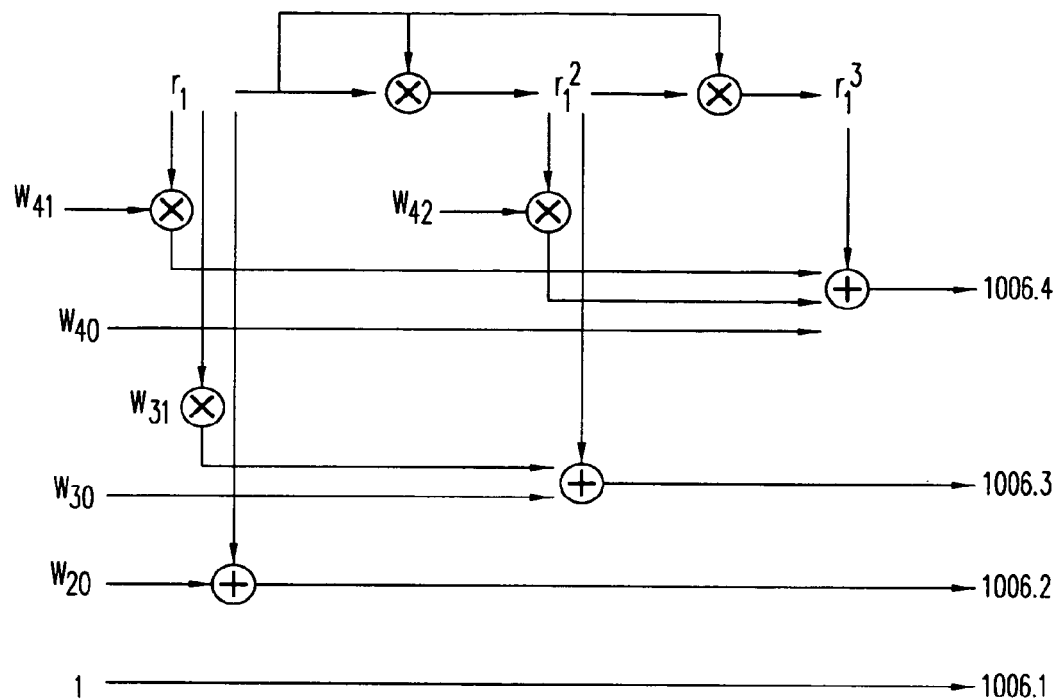
FIG. 11A shows an alternative implementation of the work function generator to decrease the number of adders and multipliers from the architecture shown in FIG. 11.
FIG. 14 shows the linear transformations that can be performed by the microprocessor 1010 shown in FIG. 10A.

To decrease the number of adders and multipliers needed to implement the work function generator 1006, the alternative architecture shown in FIG. 11A may be employed. This architecture generates four functions $r_1^3+w_4r_1^2+w_5r_1^1+w_6$, $r_1^2+w_2r_1+w_3$, $r_1^1+w_1$, and 1 as signals 1006.4, 1006.3, 1006.2, and 1006.1. Since these functions are generally not normalized with respect to each other, an additional set of gains m 1401 could be applied to normalize the coefficients p 1403 during post-processing by the microprocessor 1010, as shown in FIG. 14. Note however that according to the pre-distorter, the work functions need not be normalized, and may have unequal powers depending on the choice of gains m 1401 shown in FIG. 14.

Referring back to FIG. 10, each work function 1006.i is separately multiplied with the signal 1004a using a multiplier 1005.i to generate an output signal 1005.1a. Each signal 1004a comprises the error signal e(t) 1001 multiplied by the in-phase component p1 1002 of the reference signal, and then low-passed filtered by LPF1 1004. The LPF1 1004 contributes a gain $G_1$. Each output signal 1005.1a is then passed through a corresponding low-pass filter (LPF2) 1007.i, generating an output signal 1007.1a. The LPF2 1007.i contributes a gain $G_2$. An amplifier 1008.i, which contributes a gain of $G_3$, amplifies each output signal 1007.ia to generate a coefficient $p_i$. In an embodiment, the bandwidths of both LPF1 and LPF2 can be 400 MHz.

One of ordinary skill in the art will recognize that the gain µ of the adaptive algorithm can generally be expressed as:

$$\mu = T \cdot G_1 \cdot G_2 \cdot G_3$$

In the preferred embodiment, µ is chosen as a value between $1.25 \times 10^{-6}$ and $2.5 \times 10^{-6}$, in order to yield good convergence speed and offset-insensitivity. If T is chosen to be in the range 30-50, as previously described, then the remaining gain terms can be distributed evenly among the terms $G_1$, $G_2$, and $G_3$. Alternatively, the low-pass filter gains $G_1$ and $G_2$ can be set to equal to each other, and the amplifier gain $G_3$ can provide the necessary residual gain.

As the operations shown in FIG. 10 are all linear, each coefficient $p_i$ effectively comprises the result of correlating the signal e(t) 1001 with an analysis basis function defined as:

$$r_1 \cdot \Phi_i \cos[\omega_c(t-d) + p(t-d)],$$

where d represents the delay introduced by the coarse delay block 116 in FIG. 1. In this specification and in the claims, the operations of multiplying two signals, then low-pass filtering the product, may collectively be referred to as "correlating" the two signals. In general, the basis functions may be chosen to approximately span the inverse of the function space to which an NLC maps an input signal. The basis functions in turn dictate the choice of coefficients w 1009 for the work functions 1006.i. In this specification and in the claims, a "basis function" is equivalent to a work function (which is generally a polynomial function of an envelope signal) multiplied by a signal carrying the original phase and amplitude. Thus, the orders of the monomials in a work function polynomial are generally one less than the orders of the monomials in a corresponding basis function polynomial.

Architectures for LPF's 1004 and 1007.i are well-known to those of ordinary skill in the art. A preferred embodiment of an LPF is shown in FIG. 13.

In an embodiment of the pre-distorter wherein the error signal generator 303 generates an error signal e(t) 303a equal to tan h [T·diff], each coefficient $p_i$ output by an LPF 1007.i can be ideally expressed as:

$$p_i(t0) = \mu \int_0^{t0} \{(\Phi_i \cos \Theta) \tan h[T \cdot \text{diff}]\} dt$$

where t0 is a time index, $\Phi_i$ is the generalized polynomial work function 1006.i, and $\Theta$ is the phase component (including the carrier) of the signal 411a in FIG. 4. Similarly, in an embodiment of the Adapt Q block 403.2, each coefficient q, can be expressed as:

$$q_i(t0) = \mu \int_0^{t0} \{(\Phi_i \sin \Theta) \tan h[T \cdot \text{diff}]\} dt$$

Note that since the coefficients $p_1, \ldots, p_N$ are the correlated output signals of each analysis basis function, which can in general be polynomial functions of the reference envelope signal, a further linear transformation needs to be performed to derive a set of coefficients $a_1, \ldots, a_N$ which can be directly multiplied with the monomials $r^0$, $r^1$, $r^2$, and $r^3$ (where r corresponds to the datapath envelope signal) generated in the P and Q polynomial function synthesizers 402.1 and 402.2 shown in FIG. 4. This linear transformation can be performed by the microprocessor 1010 shown in FIG. 10A according to the operations in FIG. 14.

In a preferred embodiment, the synthesis work functions are constructed from the same weights as used to construct the analysis work functions in the work function generator 1006 of FIG. 10. One of ordinary skill in the art will recognize that in general the analysis work functions need not be identical to the synthesis work functions, and may be different if desired, e.g., to correct for any systematic bias in the system. In such an alternative embodiment, the linear transformations described below may be altered accordingly.

According to this preferred embodiment, FIG. 14 shows a matrix 1402 wherein each row corresponds to the monomial weights of a single analysis function 1006.i as defined in FIG. 11. This assumes that the synthesis work functions are identical to the analysis work functions. One of ordinary skill in the art will recognize that the pre-distorter also encompasses embodiments wherein the synthesis work functions are different from the analysis work functions. Multiplying the diagonal matrix 1401 with matrix 1402 effectively applies a gain $m_i$ to each row of 1402. The product is then multiplied by the vector 1403, which weights each coefficient of each basis function (times $m_i$) with a coefficient $p_i$ derived from the adaptive algorithm, and sums the weighted coefficients. In a preferred embodiment, a vector of offsets n 1404 may be added to compensate for any offsets in the system. These offsets n 1404 may be all zero in the preferred embodiment. The resulting vector 1405 can be input to the P Polynomial function synthesizer block 402.1 as the coefficients 402.1a. Similar operations can be performed for the Q coefficients $q_i$. One of ordinary skill in the art will recognize that the linear transformation shown in FIG. 14 can be easily extended to systems using more than four basis functions. One of ordinary skill in the art will also recognize that the linear transformation can be performed not only by a microprocessor, but by a variety of other means including analog circuitry or amplifiers.

One of ordinary skill in the art will also recognize that various options may be selected simply by configuring the linear transformation shown in FIG. 14. For example, the adaptation may be disabled for a period of time, and a fixed set of coefficients may be supplied to the synthesis work function generators, by setting the gains m 1401 to all zero, and setting the vector n to be equal to the static coefficient values. Or, depending on appropriate selection metrics, some of the work functions may be selectively disabled by setting the corresponding gains m 1401 to zero.

Note a preferred embodiment of the pre-distorter can utilize a memory compensation block 304 as shown in FIG. 3 to correct for distortion caused by memory effects exhibited by the PA 107. In particular, an NLC with memory effects generates an output signal $\text{NLC}_{memory}$ that can be modeled as:

$$\text{NLC}_{memory}(s(t)) = \text{NLC}(s(t)) + \text{NLC}(s(t-t_1)) + \ldots + \text{NLC}(s(t-t_M)),$$

where NLC( ) represents the functional transformation performed on an NLC input by an NLC without memory effects, as described earlier in (Eq. 1), and $t_1, \ldots, t_M$ represent the delays introduced by an NLC with memory effects.

Figure 15:
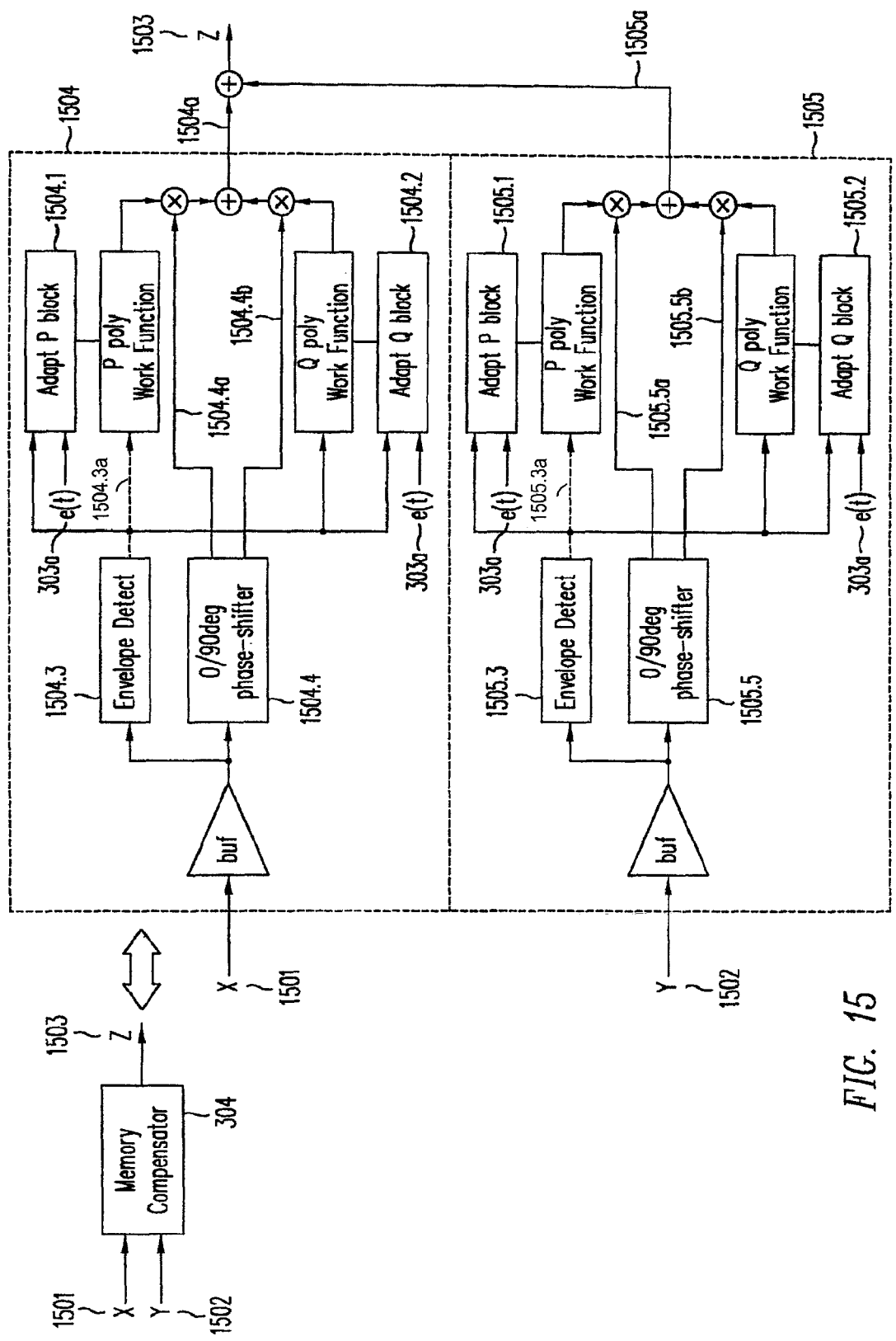
FIG. 15 shows an embodiment of a memory compensator that operates on two signals 1501 and 1502.

To correct for the distortion arising from an NLC with memory effects, FIG. 15 shows a memory compensator 304 which can utilize the adaptive algorithms described earlier to pre-distort output signals 1501 and 1502, which can correspond to delayed versions of pre-distorted 116.1a and 116.2a respectively of the datapath signal 115a shown in FIG. 2. The delays of signals 116.1a and 116.2a may be chosen to approximate the two most significant PA memory delays. One of ordinary skill in the art will recognize that the memory compensator is not limited to only two delayed signals, but in general can be applied to an arbitrary number of delayed signals by simply scaling the architecture described herein.

One of ordinary skill in the art will also recognize that each instance 1504 and 1505 of the adaptive linearizer has been simplified with respect to the implementation described in FIG. 4. In particular, both the analysis functions and the synthesis functions for 1504 are generated from the same envelope detector output 1504.3a, which works well in general if the PA delay is small, as described earlier. The memory compensator nevertheless encompasses implementations where a coarse delay block such as 116 is used. Furthermore, various signals such as P1 and Q1 of FIG. 4 are not shown in FIG. 15 for simplicity of presentation. The memory compensator can in general use all of the features disclosed in this specification for the design of the constituent instances of the adaptive linearizer (shown as 1504 and 1505 in FIG. 15), and thus the scope of the memory compensator should not be construed as being limited to that shown in FIG. 15.

In FIG. 15, signal x 1501 may be the delayed signal 116.1a in FIG. 2, and signal y 1502 may be the delayed signal 116.2a. FIG. 15 shows that signals x 1501 and y 1502 can each be processed by an independent instance 1504 or 1505 of the same architecture used for the datapath signal 115a in FIG. 4. Instances 1504 and 1505 can share the same error signal e(t) 303a as generated by the error signal generator 303 in FIG. 4. In general, as long as each memory-delayed signal is sufficiently uncorrelated with other memory-delayed signals, then the adaptive algorithm of each instance of the pre-distortion architecture will act to minimize the distortion error of a single memory-delayed signal independently of other memory-delayed signals. Note therefore that poorer performance may result when the memory-delayed signals are highly correlated with each other, eg, if the memory delays of the non-linear component are much less than the inverse of the signal bandwidth.

Note also that the analysis work functions generated internally by the Adapt P blocks 1504.1 and 1505.1 and Adapt Q blocks 1504.2 and 1505.2 should be generated from the envelope signals of the delayed input signals x 1501 and y 1502. The output signal 1504a of the instance 1504 may be summed with the output signal 1505a of the instance 1505 to arrive at an output signal z 1503. This signal z can be added to the main datapath signal 407a by an RF summer (not shown) to generate a composite pre-distorted signal that corrects for the memory effects associated with two PA memory delays.

In a further embodiment of the memory compensator, the delays of the memory effects could also be accounted for using DLL tracking, in addition to being approximated by the delays associated with the coarse delay blocks 116.1 and 116.2. In such an embodiment, a DLL can be used to lock, e.g., the signal 1501 to the residual error of the main adaptation, i.e., the difference between ($\Sigma_i p_i$ *analysis basis functions) and the error signal. This would be a decision feedback embodiment of the memory compensator, and allow the delay components of the memory compensator to better approximate the actual memory delays of the non-linear component.

One of ordinary skill in the art will recognize that the functions used to perform the correlation and the functions used to synthesize the pre-distorted (delayed) signal generally need NOT be the same functions. Rather, they may be delayed relative to each other by the PA delay, analogous to the case for the main datapath signal and the reference signal. Thus the coarse delay 116.1 may be split into two smaller delays, one of which is the PA delay currently used for 116, and one of which is the actual delay corresponding to a PA memory delay. In this case, then, the older signal may be used to perform the adaptation, while the newer signal may be used to perform the synthesis. One of ordinary skill in the art will recognize that if the PA delay (approximated by block 107 in FIG. 1) is significantly less than the PA memory delays (approximated by blocks 116.1 and 116.2), then satisfactory performance may be achieved even if the blocks 116.1 and 116.2 are not sub-divided into smaller delays. In fact, if the PA delay is negligible, the coarse delay block 116 may be omitted altogether without substantially compromising the performance of the adaptive algorithms.

Figure 16A:
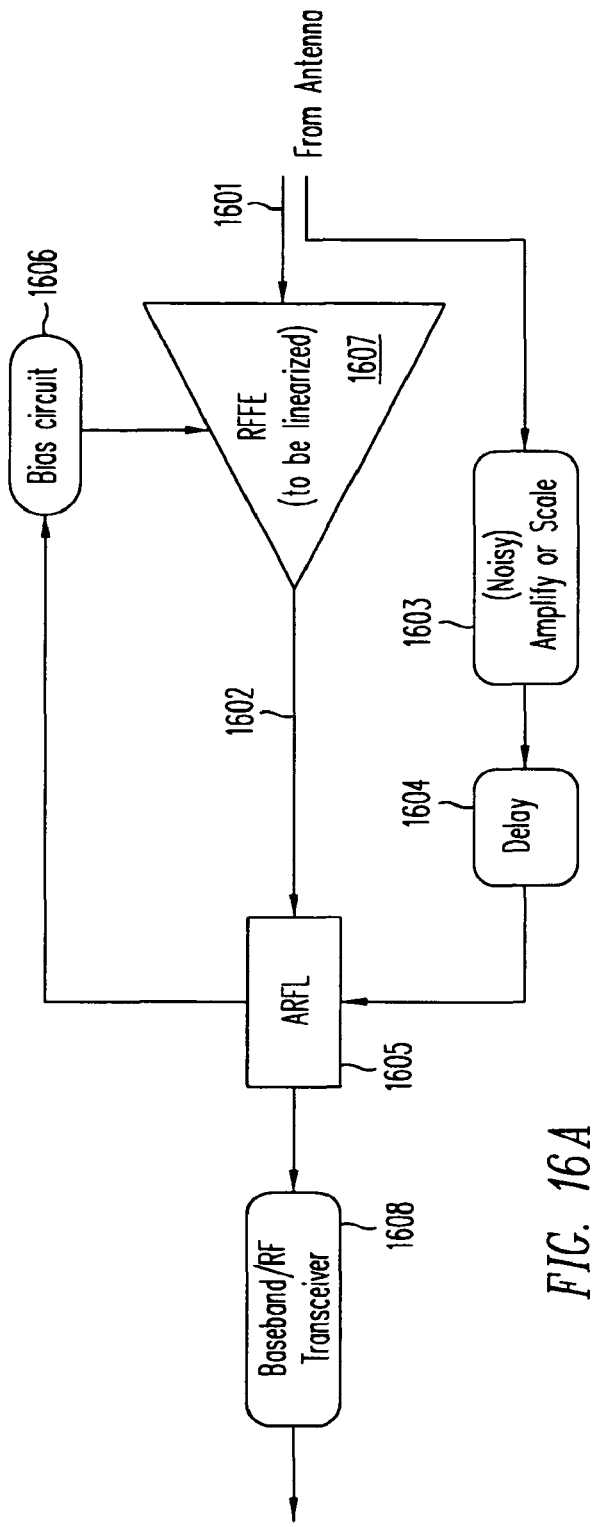
FIG. 16A shows an embodiment of the pre-distorter in the RF front-end of a radio receiver.
Figure 16B:
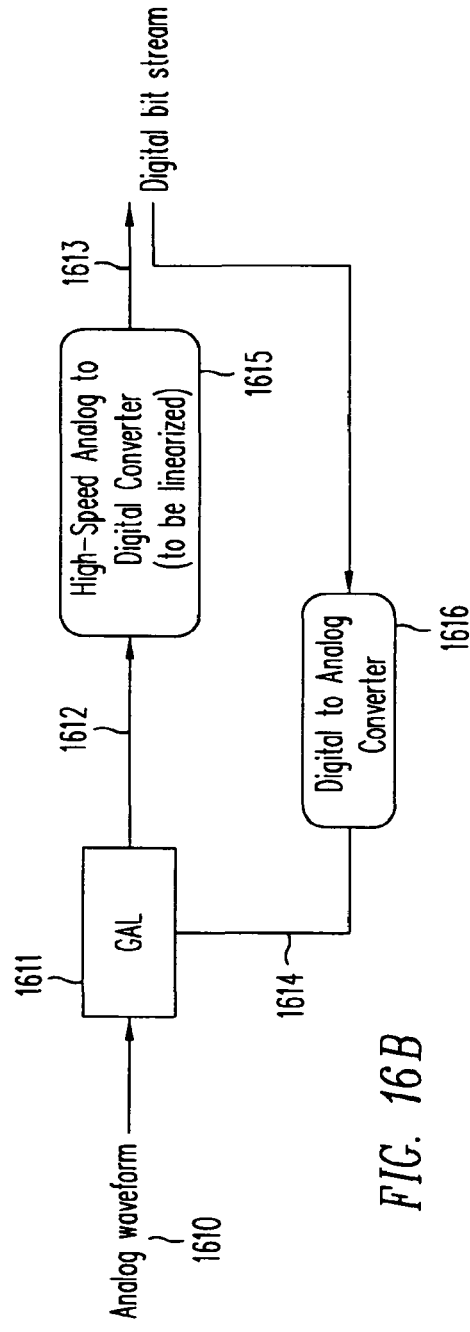
FIG. 16B shows an embodiment of the pre-distorter in a high-speed analog-to-digital converter (ADC).

FIGS. 16A and 16B show alternative embodiments of the predistortion apparatus. FIG. 16A depicts an embodiment of the predistortion apparatus 1605 (labeled "ARFL" for adaptive RF linearizer) used to linearize the output signal 1602 of the RF front end 1607 (labeled "RFFE") in a receiver chain. As shown in the diagram, the ARFL 1605 inputs an RF signal 1602 (non-linearly distorted by the RFFE 1607), a reference signal 1604 corresponding to a delayed version of the input signal 1601 to the RFFE 1607, and outputs a corrected (ideally distortion-free) signal 1608.

FIG. 16B depicts an embodiment of the predistortion apparatus 1611 (labeled "GAL" for Gigabit Adaptive Linearizer) used to linearize the analog-to-digital mapping of the analog-to-digital converter (ADC) block 1615. The GAL 1611 receives as input a gigabit analog signal 1610, a reference signal 1614 corresponding to the analog output signal of the digital-to-analog converter (DAC) 1616, and outputs a pre-distorted signal 1612.

Circuit Implementations

Various possible circuit implementations of the blocks of the pre-distortion apparatus will now be described in detail. These descriptions are meant to be illustrative only, and are not meant to limit the scope of the pre-distortion apparatus to any particular circuit implementation herein disclosed.

Envelope Detector

FIG. 5 shows a preferred embodiment of the envelope detectors 408 and 413 shown in FIG. 4. The envelope detector takes an input signal 501, and outputs an envelope signal 510 that is a low-pass filtered version of the absolute value of the input signal 501. The bandwidth of the low-pass filter may be adjusted by adjusting the capacitance C1 of the capacitor 504. In a preferred embodiment, the capacitance C1 is chosen in conjunction with the output resistance of the current source I1 in FIG. 5 to provide for a bandwidth of about 20 MHz.

An alternative embodiment of the envelope detector known as an "orthogonal peak detector" is shown in FIG. 5A. In this embodiment, an in-phase component signal 513 and a quadrature-phase component signal 512 are generated from the input signal 511. Component signals 512 and 513 are squared using multipliers 512.1 and 513.1, respectively. The squared signals are summed using adder 515.1, to give a squared envelope signal 516, from which the square root generator 516.1 generates the envelope signal 517. Note that in a preferred embodiment, the quadrature generator 511.1 has nominally unity gain, and any actual difference from unity gain may be compensated in the non-quadrature path by applying a corresponding gain using an amplifier (not shown). Note the gain of such an amplifier may be compensated for elsewhere in the signal path, eg in the RFVGA.

Figure 5B:
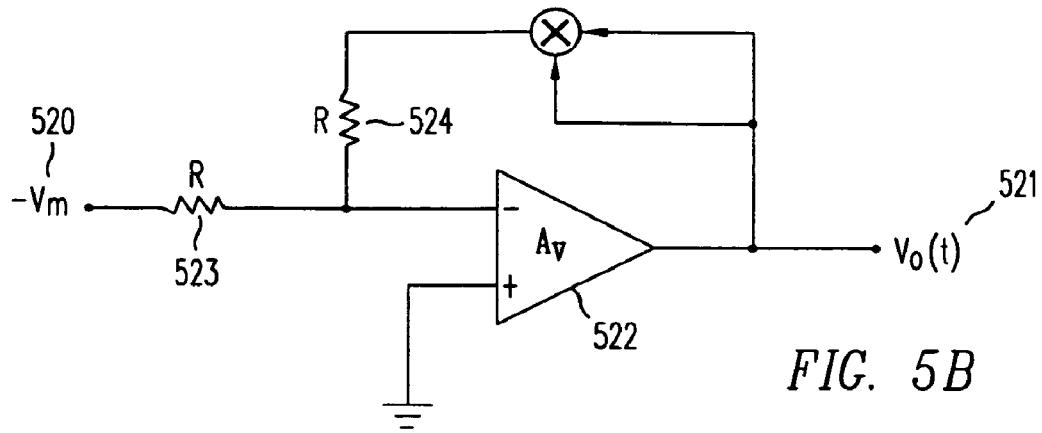
FIG. 5B shows an implementation of the square root generator block shown in FIG. 5A.

FIG. 5B shows an embodiment of the square root generator 516.1 in FIG. 5A. In a preferred embodiment, the amplifier 522 is a voltage amplifier with high input impedance and low driving point output impedance. Furthermore, the amplifier gain need not be large unless the resistors 523 and 524 are not well-matched.

Figure 5C:
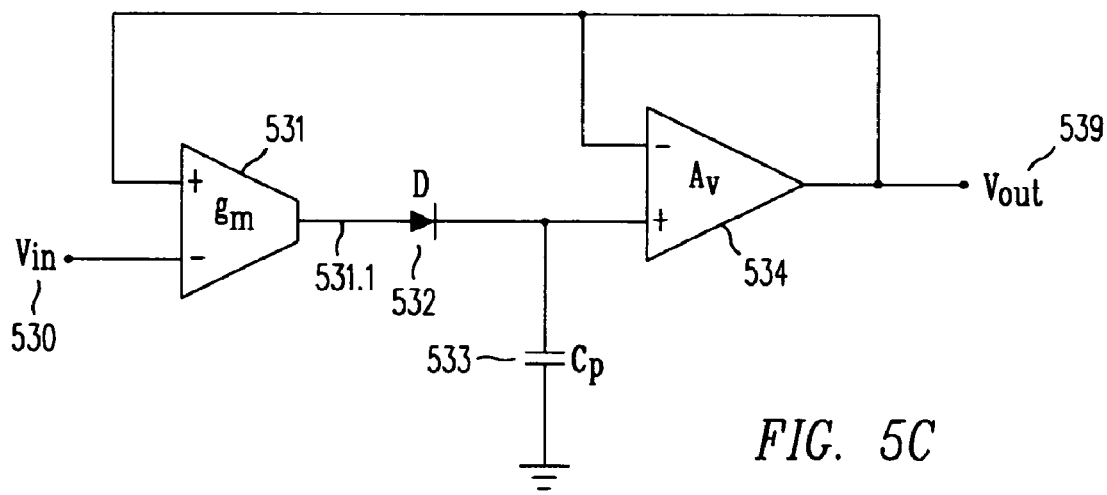

FIG. 5C shows an alternative embodiment of an envelope detector, known as a "diode peak detector." This embodiment comprises a transconductor 531, a diode 532, a capacitor 533, and a voltage amplifier 534. The transconductor 531 accepts as input signals the envelope detector input signal 530 and the envelope detector output signal 539. When signal 539 is greater than signal 530, the transconductor 531 generates current in the direction of arrow 531.1, which forward biases the diode 532 to charge the capacitor 533. When signal 539 is less than 530, the transconductor 531 outputs current in the direction against the arrow 531.1, thus reverse-biasing the diode 532, and preventing any current from the transconductor 531 from discharging the capacitor 533. Thus, the combination of the diode 532 and capacitor 533 functions as a rectifier. As amplifier 534 is configured to be a unity gain buffer, signal 539 follows the voltage across the capacitor 533.

Ideally, no external resistance is required for the capacitor 533 to discharge, as the inherent terminating input resistances of the voltage amplifier 534 may be utilized. In a preferred embodiment, the input resistance of the voltage amplifier 534 can be relatively low at 100-200Ω, and the capacitance of capacitor $C_p$ can be chosen to give an RC time constant on the order of $1/(2\pi f)$ seconds, where f is the operating frequency in Hz. In a preferred embodiment, the operating frequency is a frequency less than 2.2 GHz.

Figure 5D:
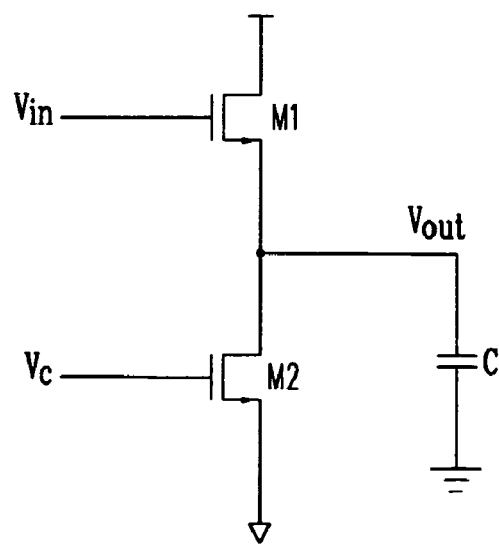

Yet another embodiment of a peak detector is shown in FIG. 5D. In FIG. 5D, an input signal $V_{in}$, is applied to the gate of transistor M1 configured as a source follower. During envelope detection, transistor M2 is turned off, and the voltage $V_{out}$ across the capacitor C follows the envelope of the input signal $V_{in}$. To reset the voltage $V_{out}$, transistor M2 can be turned on.

One of ordinary skill in the art will recognize that various alternative implementations of envelope detectors known in the art may be substituted for the detectors shown in FIGS. 5-5D. The disclosed implementations are not meant to limit the scope of the pre-distortion apparatus.

Quadrature Generator

Figure 6C:
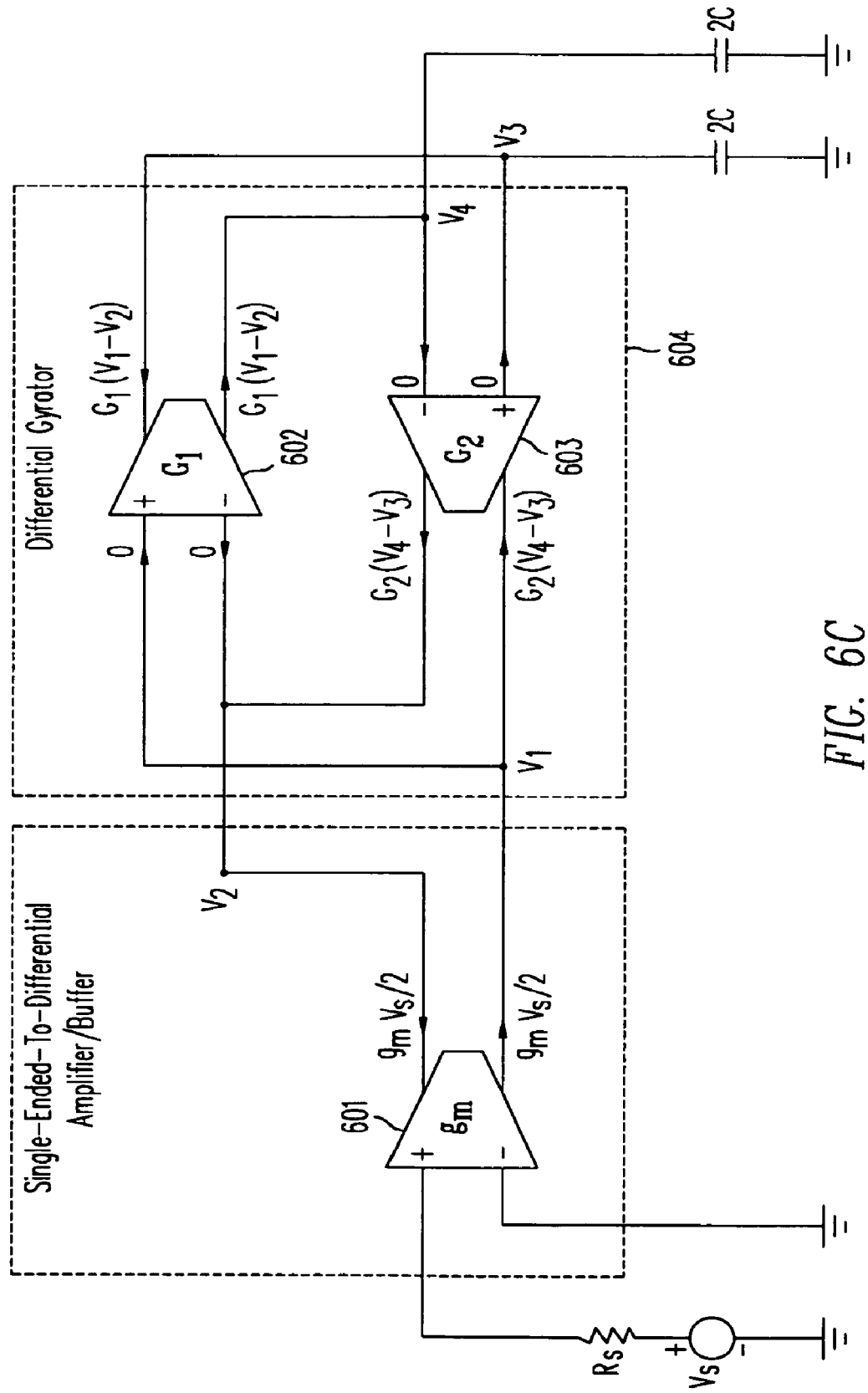
FIG. 6C shows a quadrature phase generator implemented using an active LC network circuit.

FIGS. 6A-6H show several possible embodiments of quadrature phase generators 401 and 414 shown in FIG. 4. FIG. 6A shows a standard RC-CR network well known in the prior art. (See, e.g., Behzad Razavi, *RF Microelectronics*, Prentice Hall PTR (1998), pp 138-139.)

FIG. 6B shows a phase-shifter implemented using a Hilbert transformer 690.

FIG. 6C shows a quadrature generator implemented using an active LC network circuit. The following equations show the relationships of the signals in FIG. 6C:

$$V_2 = -V_1$$
$$V_3 = -V_4$$
$$V_4 = \frac{G_1(V_1 - V_2)}{2sC}$$
$$= \frac{G_1 V_1}{sC},$$

where $G_1$ and $G_2$ represent the forward transconductances of the respective transconductors 602 and 603 shown in FIG. 6C, and s is the Laplace transform variable. It can be seen therefore that the differential signal $V_1$-$V_2$ will have a quadrature phase relationship with the differential signal $V_3$-$V_4$.

Referring to FIG. 6C, a differential-input-to-differential-output transconductor block 601 converts a single-ended input signal $V_s$ to a signal current of $g_m V_s/2$ that flows into transconductor 601 at one of its output ports and out of transconductor 601 at its other output port. Voltages $V_1$ and $V_2$ are supplied to a differential gyrator 604, which generates output signals $V_3$ and $V_4$. The differential gyrator 604 comprises two transconductors 602 and 603.

Figure 6D:
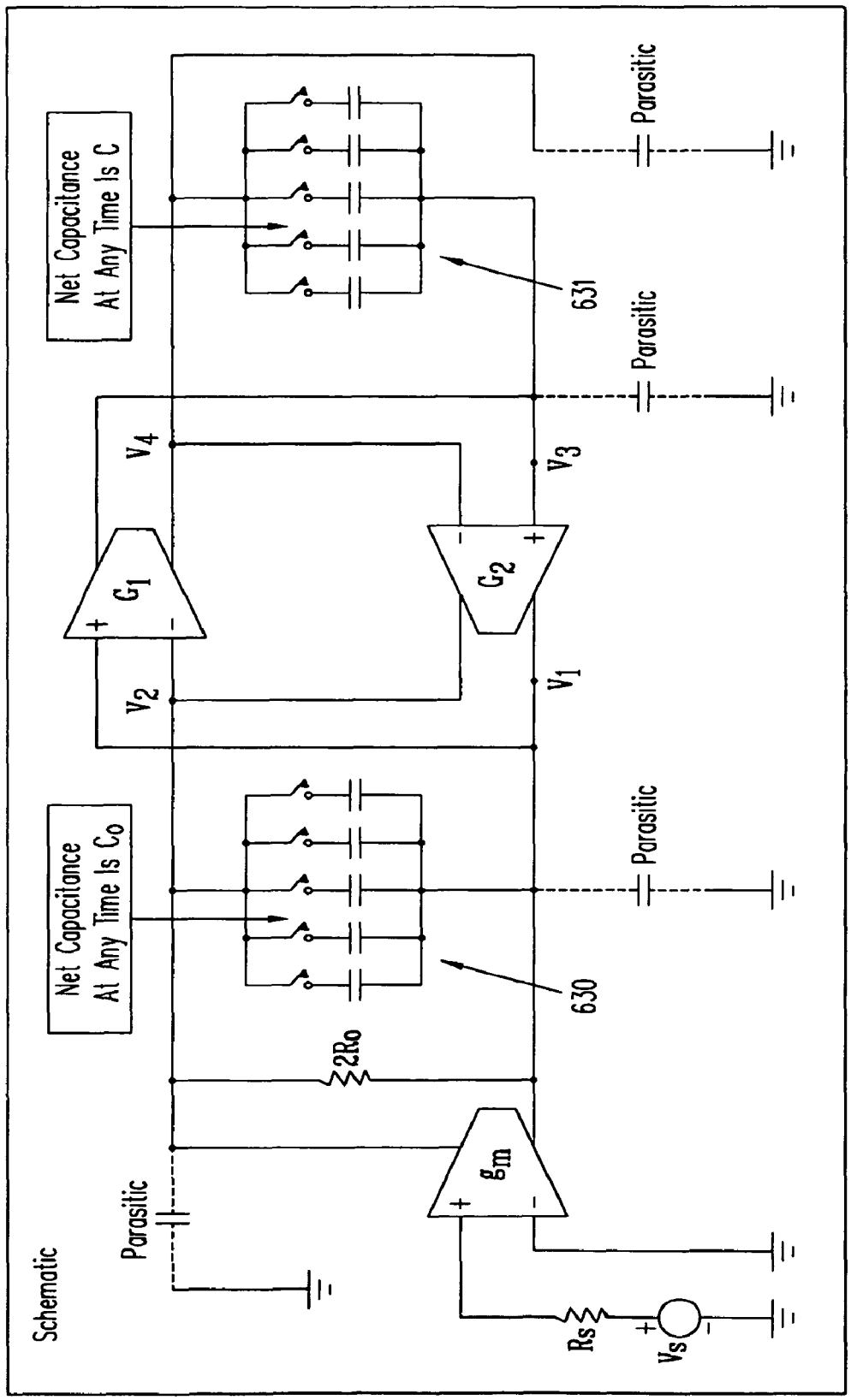
FIG. 6D shows a modified active LC circuit wherein the capacitance C is adjustable by configuring a set of switches connected to a series of capacitors 630.
Figure 6E:
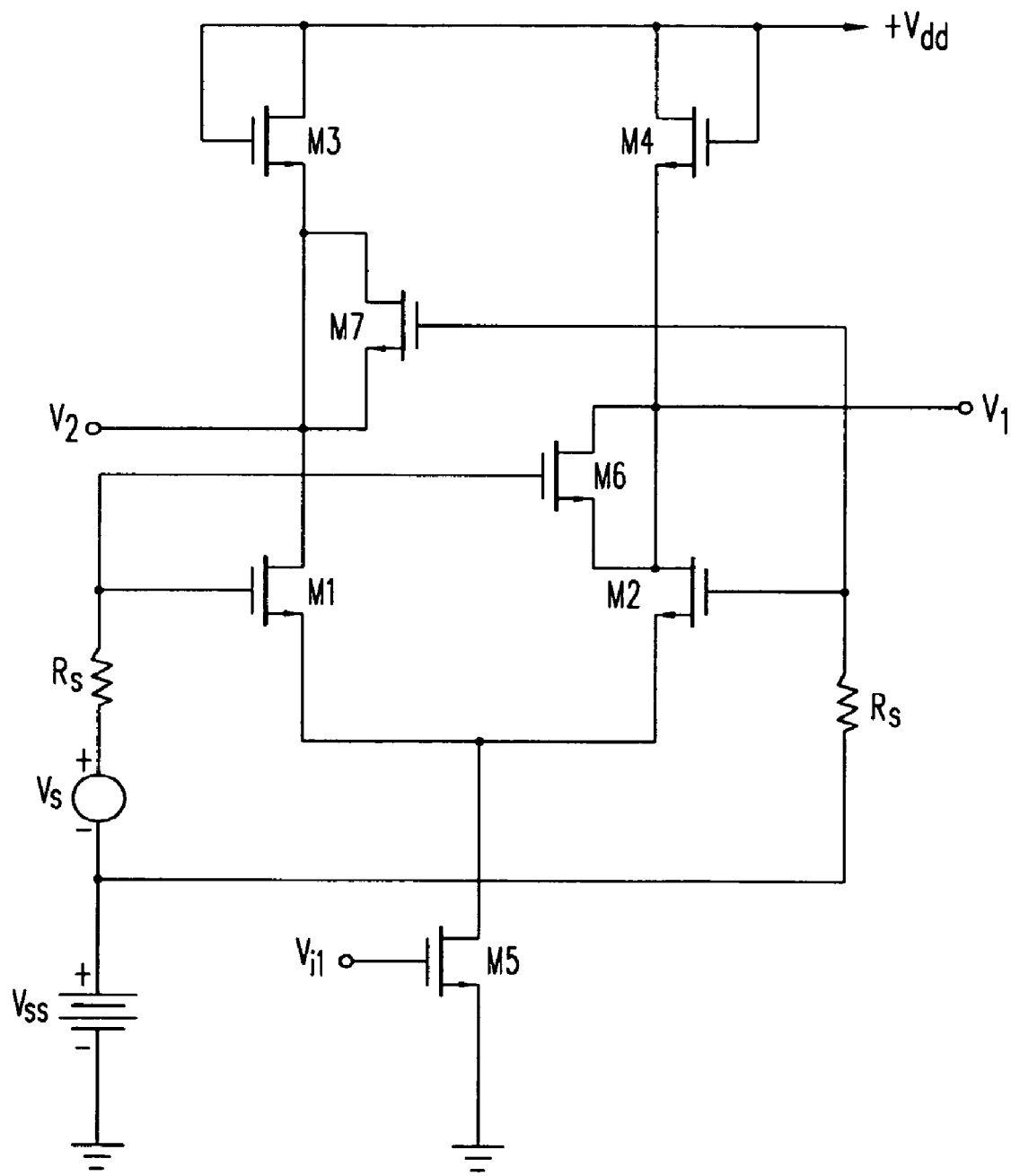
FIG. 6E shows an embodiment of the input stage block 601 in FIG. 6C.
Figure 6F:
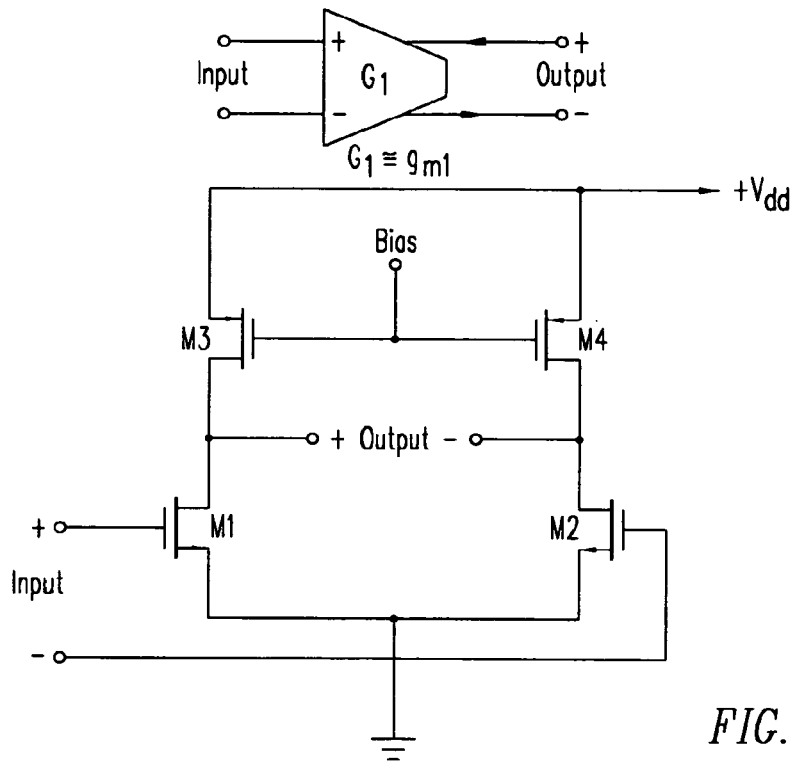
FIG. 6F shows an implementation of one of the transconductors G1 or G2 in the differential gyrator 604 shown in FIG. 6C.
Figure 6G:
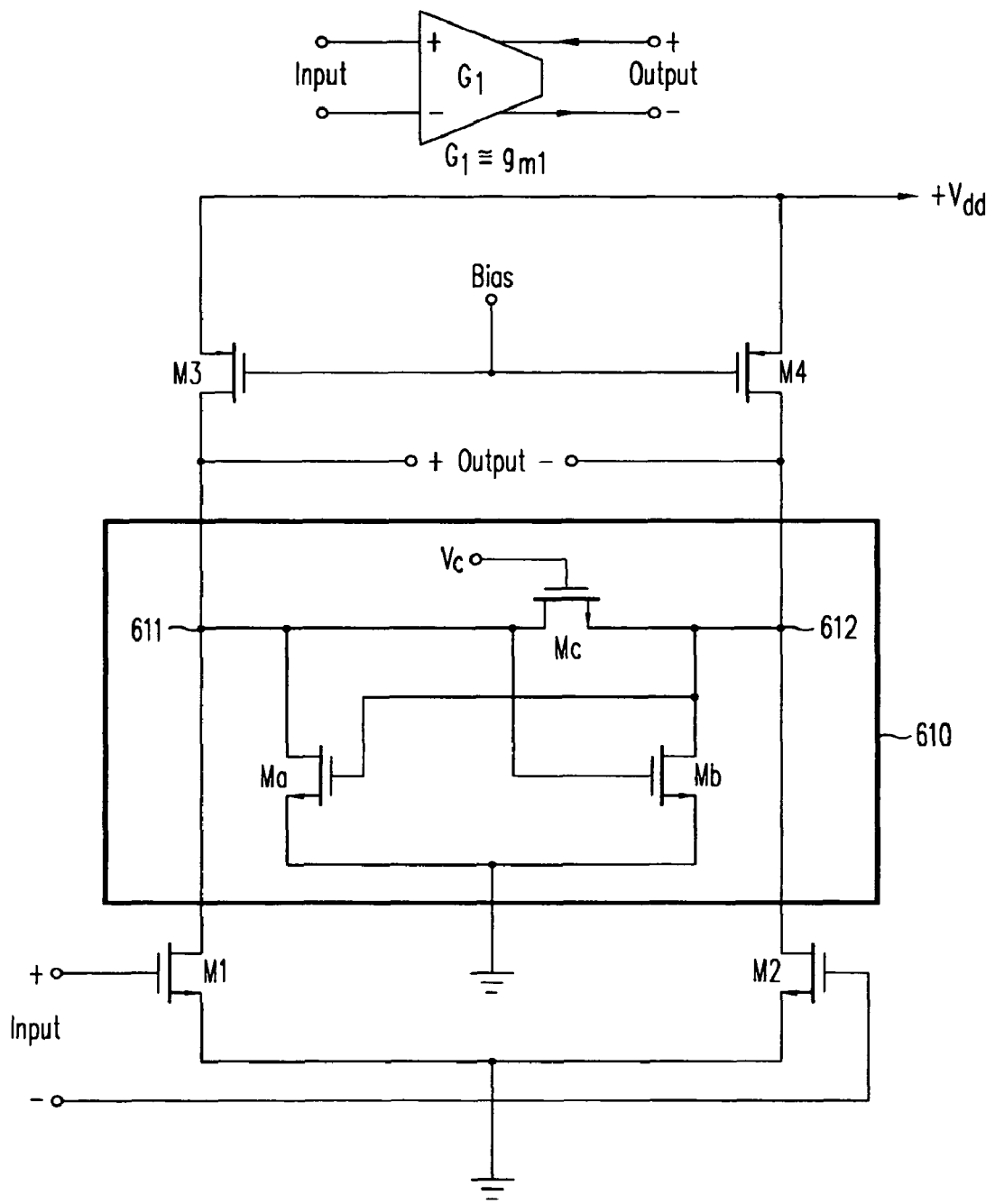
FIG. 6G shows a modified version of the transconductor circuit shown in FIG. 6F.

FIG. 6G shows one embodiment of the active LC network circuit of FIG. 6C, wherein the input transconductance stage 601 is modeled as two transconductors 620 and 621 that each generate a signal current proportional to the input voltage $V_s$.

A resistance $R_0$ and a capacitance $C_0$ are also associated with each of the two transconductors 620 and 621.

The transfer functions of this circuit can be derived as:

$$H_1(s) = \frac{V_1}{V_s} = -\frac{V_2}{V_s} = \frac{\left(\frac{H_0 s}{Q\omega_0}\right)}{1 + \frac{s}{Q\omega_0} + \left(\frac{s}{\omega_0}\right)^2}$$

$$H_2(s) = \frac{V_4}{V_s} = -\frac{V_3}{V_s} = \frac{\left(\frac{H_0 G_1}{Q\omega_0 C}\right)}{1 + \frac{s}{Q\omega_0} + \left(\frac{s}{\omega_0}\right)^2},$$

where:

$$H_0 = \frac{g_m R_0}{2}$$

$$\omega_0 = \sqrt{\frac{2G_1 G_2}{C C_0}}$$

$$Q = R_0 \sqrt{\frac{C_0}{C}} \sqrt{2G_1 G_2}$$

In the above equations, the parameter $H_0$ corresponds to the center frequency gain of the $H_1(j\omega)$ transfer function or the low-frequency gain of the $H_2(j\omega)$ transfer function, $\omega_0$ corresponds to the center frequency of the $H_1(j\omega)$ transfer function or the 3-dB bandwidth of the $H_2(j\omega)$ transfer function, and Q corresponds to the quality factor of the $H_1(j\omega)$ transfer function or the $H_2(j\omega)$ transfer function.

To allow the quadrature generator to operate over a broad range of frequencies, the parameters may be adjusted based on the particular frequency range. FIG. 6D shows a modified active LC circuit wherein the capacitance C is adjustable by configuring a set of switches connected to a series of capacitors 631. The capacitance C may be implemented as a bank of switchable shunt capacitors, up to five capacitors in an embodiment, to afford amplitude equalization of the in-phase and quadrature components throughout the passband of interest. The banks allow dynamic setting of the parameter C, which controls the parameters Q and $\omega_0$ per the equations given above.

FIG. 6D also shows the technique of employing a bank of capacitors to allow selective switching of the capacitance $C_0$. One of ordinary skill in the art will note that as the capacitors shown in FIG. 6D are connected in shunt across their respective nodes V1-V2 and V3-V4, whereas the capacitors shown in FIG. 6C are shunted to ground, appropriate scaling in values should be made.

Note that proper design also requires accounting for the parasitic capacitances (labeled "Parasitic" in FIG. 6D) present at the nodes corresponding to voltages V1, V2, V3, and V4.

For fine-tuning the capacitance C or $C_0$, one or more of the capacitors in each bank may be continuously adjustable via voltage control. This may be accomplished by implementing these capacitors as varactors or MOSCAPs.

In a preferred embodiment, the parameters $g_m$, C, $C_0$, $R_0$, $G_1$ and $G_2$ are chosen as follows:

$$G_2 R_0 = \frac{1}{2}$$

$$\frac{G_1}{G_2} = \frac{16}{25}$$

$$\omega_0 = 2\pi f_0 = \frac{5G_1}{4C},$$

wherein $f_0$ is selectable among five different values 0.982, 1.237, 1.557, 1.961, and 2.470 GHz by appropriate switching of the capacitors within the capacitor bank. These settings enable broadband operation over the approximate frequency range 0.7-2.218 GHz with generally less than 1-dB gain difference between the I and Q components.

A transistor implementation of the input stage block 601 in FIG. 6C is shown in FIG. 6E. In this circuit, transistors M1 and M2 comprise a differential pair, and transistors M3 and M4 comprise load devices. Transistors M6 and M7 have shorted drain and source terminals, and are disposed at the nodes corresponding to output voltages V1 and V2, respectively. It is seen that transistors M6 and M7 are configured as MOS capacitors (MOSCAP's). When sized appropriately, capacitors M6 and M7 can help neutralize the gate-drain capacitances of transistors M1 and M2, helping to mitigate bandwidth degradation incurred by Miller multiplication.

In an embodiment, the gate areas of M6 and M7 may be chosen to be nominally 15% larger than those of M1 and M2 to account for second order gate overlap and other phenomena associated with transistor gate-drain capacitances. In general, preferred W/L ratios for the transistors will be within a range of 4 to 100, and preferably within a range of 4 to 20.

FIG. 6F shows a possible implementation of one of the transconductors $G_1$ or $G_2$ in the differential gyrator 604 shown in FIG. 6C. This implementation is appropriate if common-mode signal components at the input port are negligible. Note the input stage can be a simple differential pair. In a preferred embodiment, the output resistance of the transconductor can be boosted to better approximate an ideal current source by using the circuit shown in FIG. 6G.

The circuit in FIG. 6G incorporates a negative resistance block 610 in shunt between the output nodes 611 and 612. This block 610 presents an impedance $R_{12}$ between nodes 611 and 612 expressed as:

$$\frac{1}{R_{12}} = \frac{1}{2r_{oa}} + \frac{1}{r_{oc}} - \frac{g_{Ma}}{2},$$

where $r_{oa}$ and $r_{oc}$ represent the small-signal drain-source channel resistances of transistors Ma and Mc, respectively (assuming Ma and Mb are matched and have identical output resistances), and $g_{Ma}$ is the transconductance of transistor Ma. The negative resistance of the block 610 is adjustable via the control voltage Vc. The negative resistance block 610 overall acts to increase the possibly small channel resistances of transistors M1 and M2 shown in FIG. 6G. Because the outputs of the transconductor blocks function effectively as current sources, the output resistance should be made large, preferably on the order of at least 5,000 Ohms.

Figure 6H:
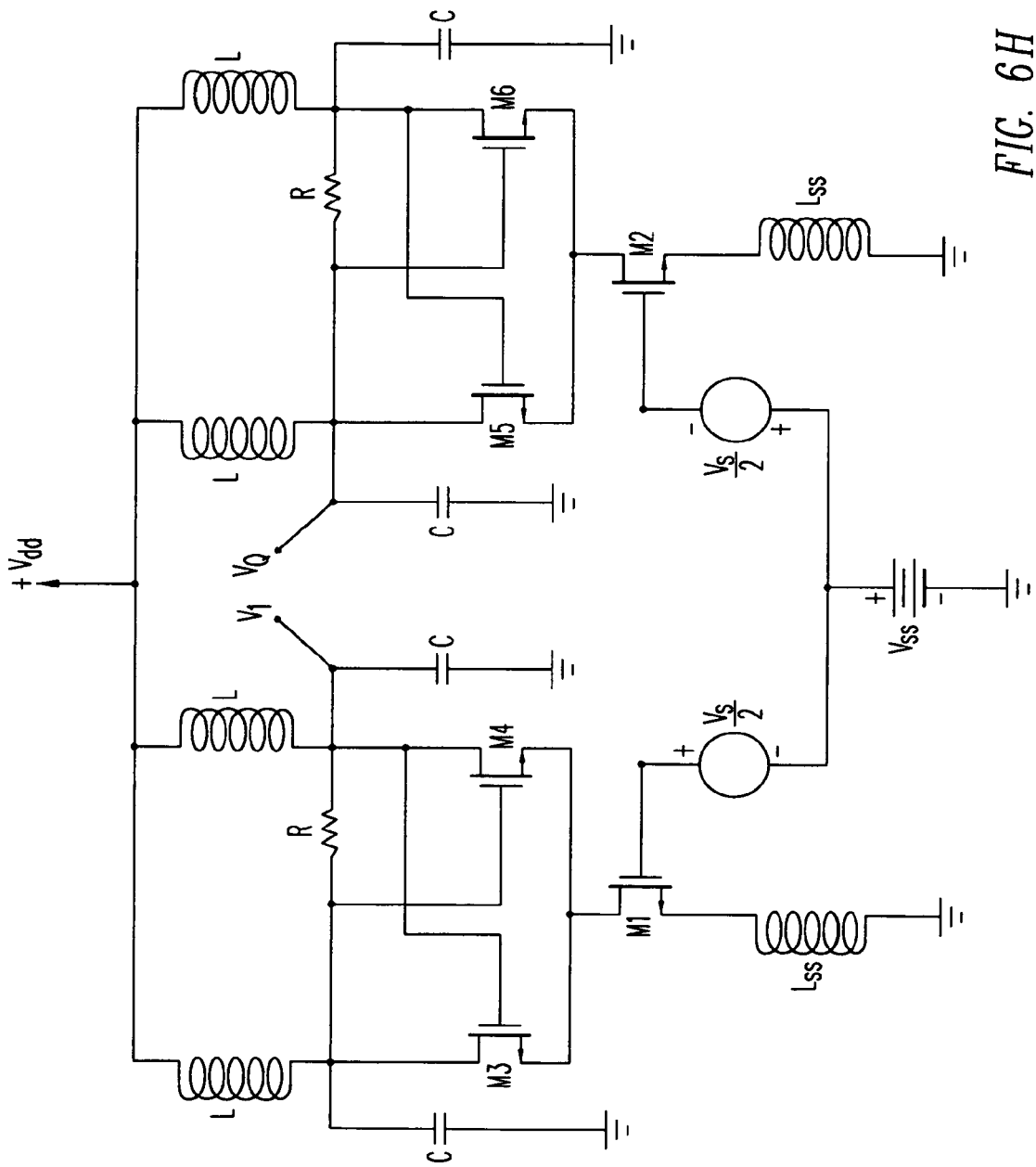
FIG. 6H shows yet another possible embodiment of a quadrature-phase generator known as an injection-locked quadrature generator.

FIG. 6H shows yet another possible embodiment of a quadrature-phase generator known as an "injection-locked quadrature generator," which is suitable for high-frequency operation. In this embodiment, the two differential pairs, M3-M4 and M5-M6, in conjunction with the resonant circuits comprised of inductances L, capacitances C, and resistances R form low quality factor negative resistance oscillators. The resonant circuits are tuned to half of the frequency of the applied differential signal, $V_s$. This signal establishes sinusoidal tail currents flowing through M1 and M2, where the tail current of M2 is 180 degrees out of phase with that of M1. The high impedance at the drains of M1 and M2 establish virtual signal grounds at the source terminals of each of the two differential pairs. The inductances, $L_{ss}$, are used to establish 50-Ohm input terminations for $V_s$ at the frequency implicit to Vs. Because the output signals, $V_I$ and $V_Q$ are referenced to ground, and hence to the aforementioned virtual grounds, they represent gate-source voltages of M3-M4 and M5-M6. But the gate source voltage is a square root function of the drain current. Since the current in the drains of M5-M6 are 180 degrees phase displaced from those of M3-M4, $V_I$ is resultantly a sinusoid at half the frequency of $V_s$ while $V_Q$ is likewise a sinusoid at half the frequency of $V_s$, but 90 degrees out of phase with $V_I$.

Thus to generate I and Q versions of a signal $V_{input}$ using the above scheme, $V_{input}$ may be first squared using a multiplier, and the squared signal supplied to the circuit in FIG. 6H as $V_s$.

One of ordinary skill in the art will appreciate that the above method of quadrature generation need not be implemented using identical components as disclosed in FIG. 6H. In general, quadrature generation may be effected by simply squaring an input signal, providing positive and negative versions of the squared signal, and separately applying a square root function to each of the positive and negative versions of the squared signal. The resultant two square-rooted signals will then necessarily have a quadrature relationship.

One of ordinary skill in the art will appreciate that various implementations of a quadrature generator are possible other than those disclosed herein with respect to FIGS. 6A-6H. The disclosed implementations are not meant to limit the scope of the pre-distortion apparatus.

Variable-Gain Amplifier (VGA)

Figure 8:
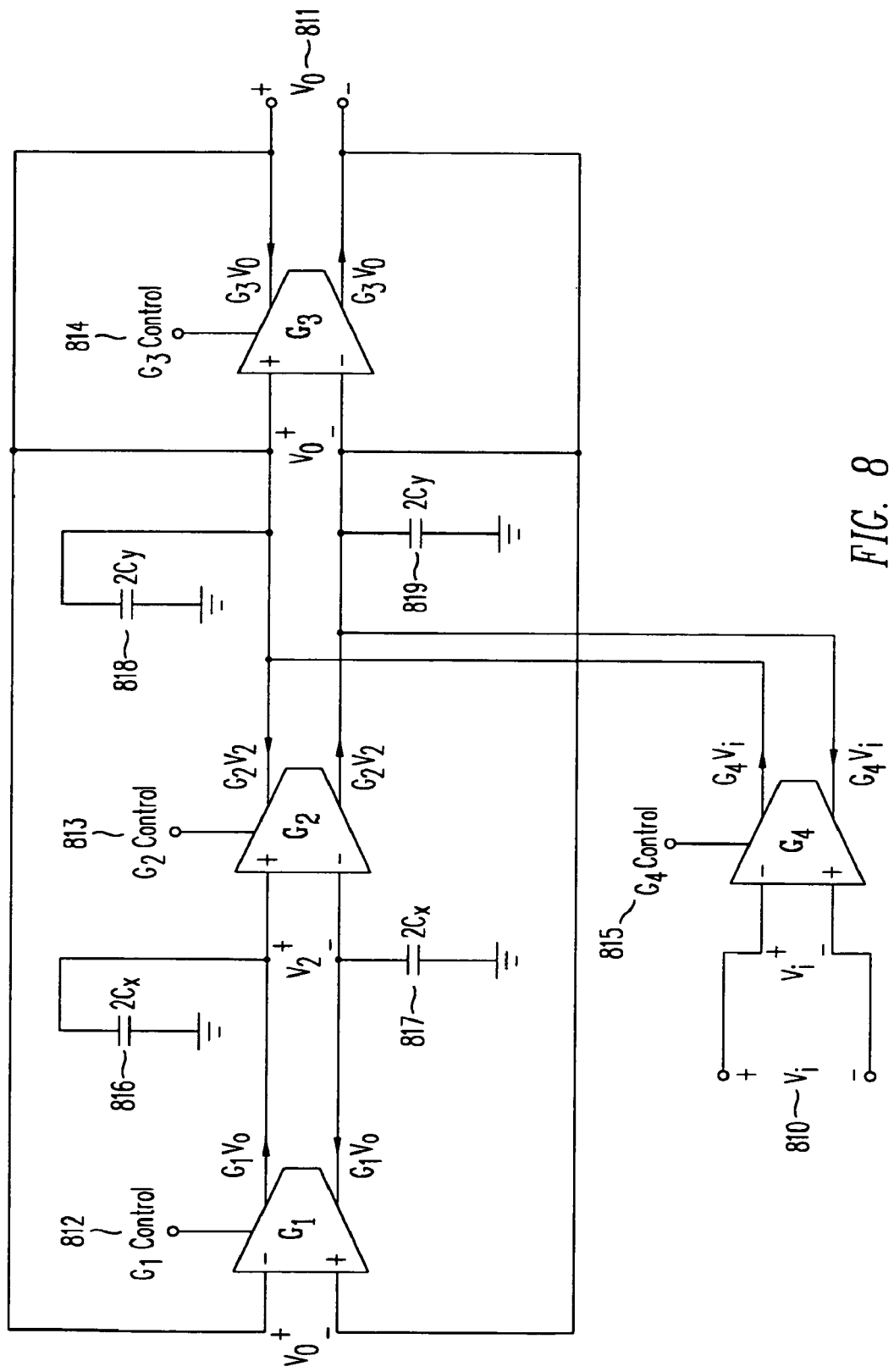
FIG. 8 shows a preferred implementation of the RF variable-gain amplifiers (VGA) 405.1 and 405.2 in FIG. 4.

FIG. 8 shows a preferred implementation of the RF variable-gain amplifiers (VGA) 405.1 and 405.2 in FIG. 4 using transconductors, i.e., circuits that convert voltage signals into current signals. The differential input signal 810 can be the I signal 401a or Q signal 401b shown in FIG. 4. The RF VGA comprises an input signal 810, an output signal 811, and a plurality of control signals $G_1$ Control 812, $G_2$ Control 813, $G_3$ Control 814, and $G_4$ Control 815. The VGA further comprises capacitors 816, 817, 818, and 819. By adjusting the control signals 812-815 and capacitances of capacitors 816-819, the gain, center frequency, 3-dB bandwidth, and quality factor of the transfer function between the input signal 810 and the output signal 811 can all be independently adjusted. The transfer function of the VGA shown in FIG. 8 can be expressed as:

$$H(s) = \frac{V_o}{V_i} = \frac{H(j\omega)\left(\frac{s}{Q\omega_0}\right)}{1 + \frac{s}{Q\omega_0} + \left(\frac{s}{\omega_0}\right)^2}$$

$$= \frac{s\left(\frac{G_4 C_x}{G_1 G_2}\right)}{1 + s\left(\frac{G_3 C_x}{G_1 G_2}\right) + s^2\left(\frac{C_x C_y}{G_1 G_2}\right)}$$

In these expressions, $\omega_0$ represents the tuned center frequency in radians, $H(j\omega_0)$ represents the amplifier gain at the tuned center frequency $\omega_0$, and Q represents the quality factor of the bandpass transfer characteristic. From the above transfer function, the tunable parameters of the VGA are seen to be:

$$\omega_0 = 2\pi f_0 = \sqrt{\frac{G_1 G_2}{C_x C_y}}$$

$$H(j\omega_0) = \frac{G_4}{G_3}$$

$$B = \frac{\omega_0}{Q} = \frac{G_3}{C_y} = \text{(3-dB bandwidth)}$$

$$Q = \frac{\sqrt{G_1 G_2}}{G_3}\sqrt{\frac{C_y}{C_x}}$$

Each of these parameters may thus be set by appropriately choosing the control signals 812-815 and capacitances of capacitors 816-819. One of ordinary skill in the art will realize that fewer or more transconductors may be provided than shown in FIG. 8, along with associated capacitances, to afford fewer or more degrees of freedom in choosing the design parameters. For example, an additional transconductor with a configurable gain may be disposed in series between $G_1$ and $G_2$ shown in FIG. 8.

Figure 8A:
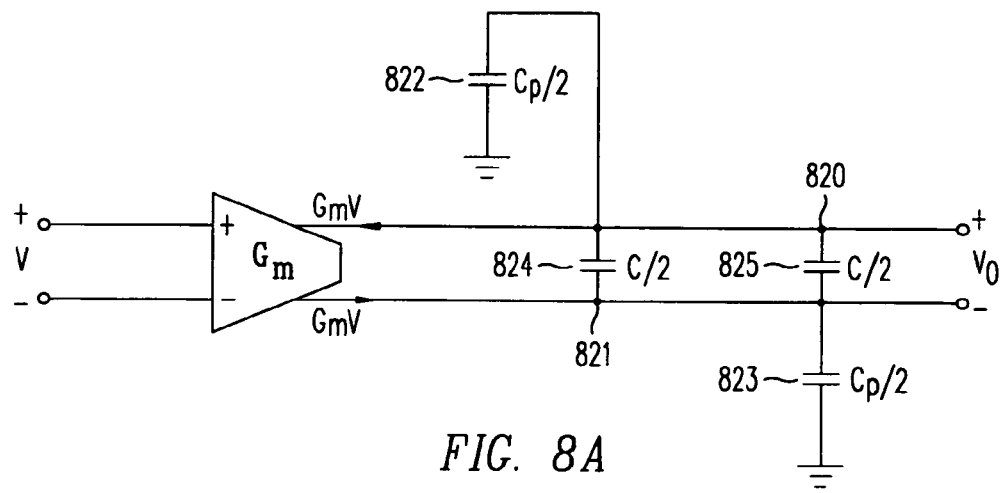
FIG. 8A shows an alternative capacitor arrangement for one of the transconductors in the VGA shown in FIG. 8.

FIG. 8A shows an alternative capacitor arrangement for the VGA shown in FIG. 8. Parasitic capacitances 822 and 823 may be incorporated into the values of the overall capacitances at nodes 820 and 821. Note two shunt capacitors 824 and 825, each of capacitance C/2, may be used rather than one capacitor of capacitance C to sustain signal condition balance, since in general any monolithic capacitance may be accompanied by an unavoidable parasitic capacitance at one (but generally not both) of its terminals.

Figure 8B:
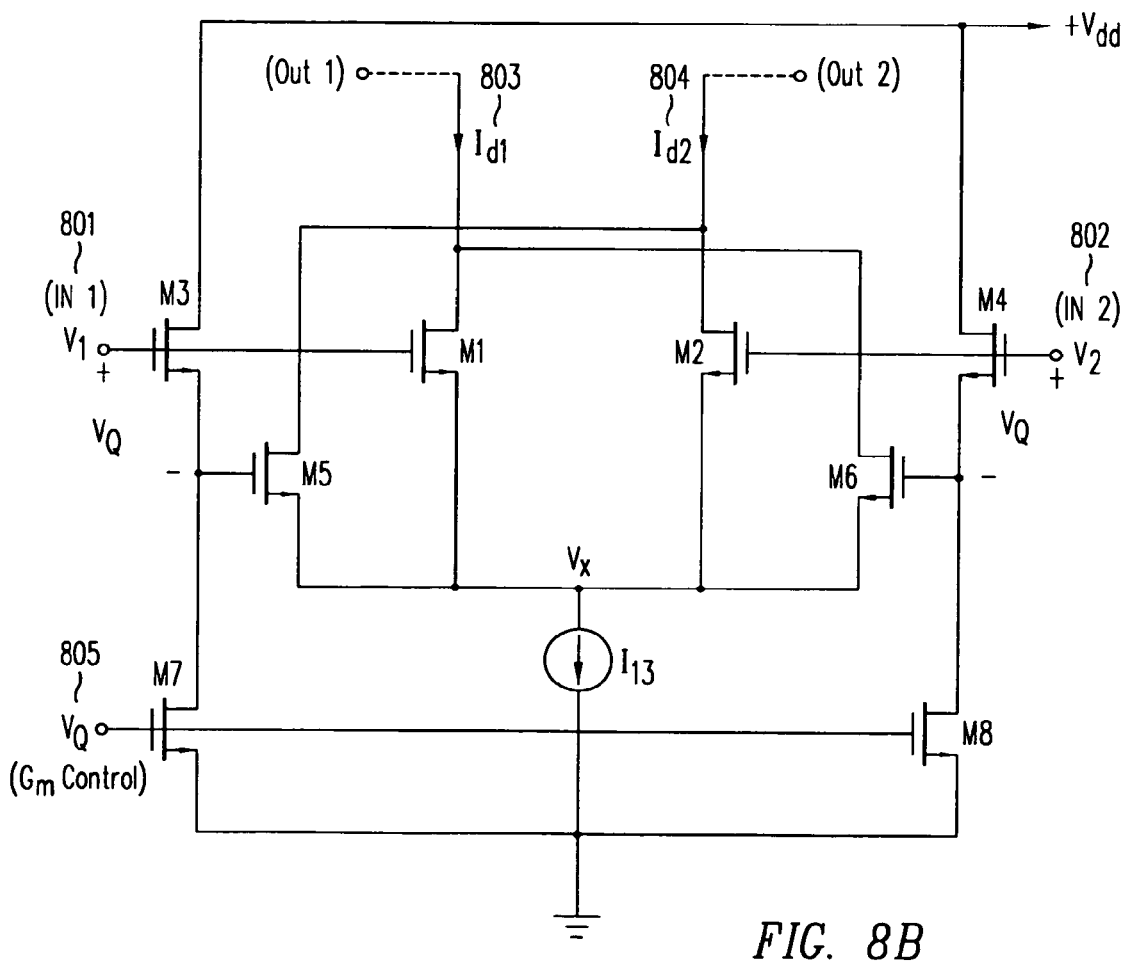
FIG. 8B shows a circuit implementation of the transconductors G1, G2, G3, and G4.

FIG. 8B shows a circuit implementation of the transconductors G1, G2, G3 and G4. This circuit accepts a differential input signal comprising the signals $V_1$ 801 and $V_2$ 802. The gain of the transistors M3 and M4 can be varied based on an input signal $V_Q$ 805. The differential output signal of the circuit comprises the difference between the currents $I_{d1}$ and $I_{d2}$. In the circuit shown, by cross-coupling the drain connections of M5 with M2, and by cross-coupling the drain connections of M6 with M1, and while sinking the drain currents of all four of these devices through a common, constant current sink, $I_{ss}$, large-signal linearity between the differential current response, $I_{d1}$-$I_{d2}$, and the differential input signal, $V_1$-$V_2$, is achieved. Moreover, the topology renders the constant of proportionality between the differential output current and the differential input voltage itself linearly proportional to the indicated control voltage, $V_Q$. Note that the current source $I_{ss}$ should provide a relatively constant current, with ideally very high output resistance.

Note in a preferred implementation, transistors M1, M2, M5, and M6 are matched.

The relationships of the signals in the circuit are given as:

$$I_{d1}-I_{d2}=G_m(V_1-V_2)$$

$$G_m=K_n(W/L)V_Q,$$

where $K_n$ is the NMOS transconductance density parameter $\mu_n C_{ox}$, and W and L are the width and length, respectively, of the channel areas of transistors $M_1$ and $M_2$.

Figure 8C:
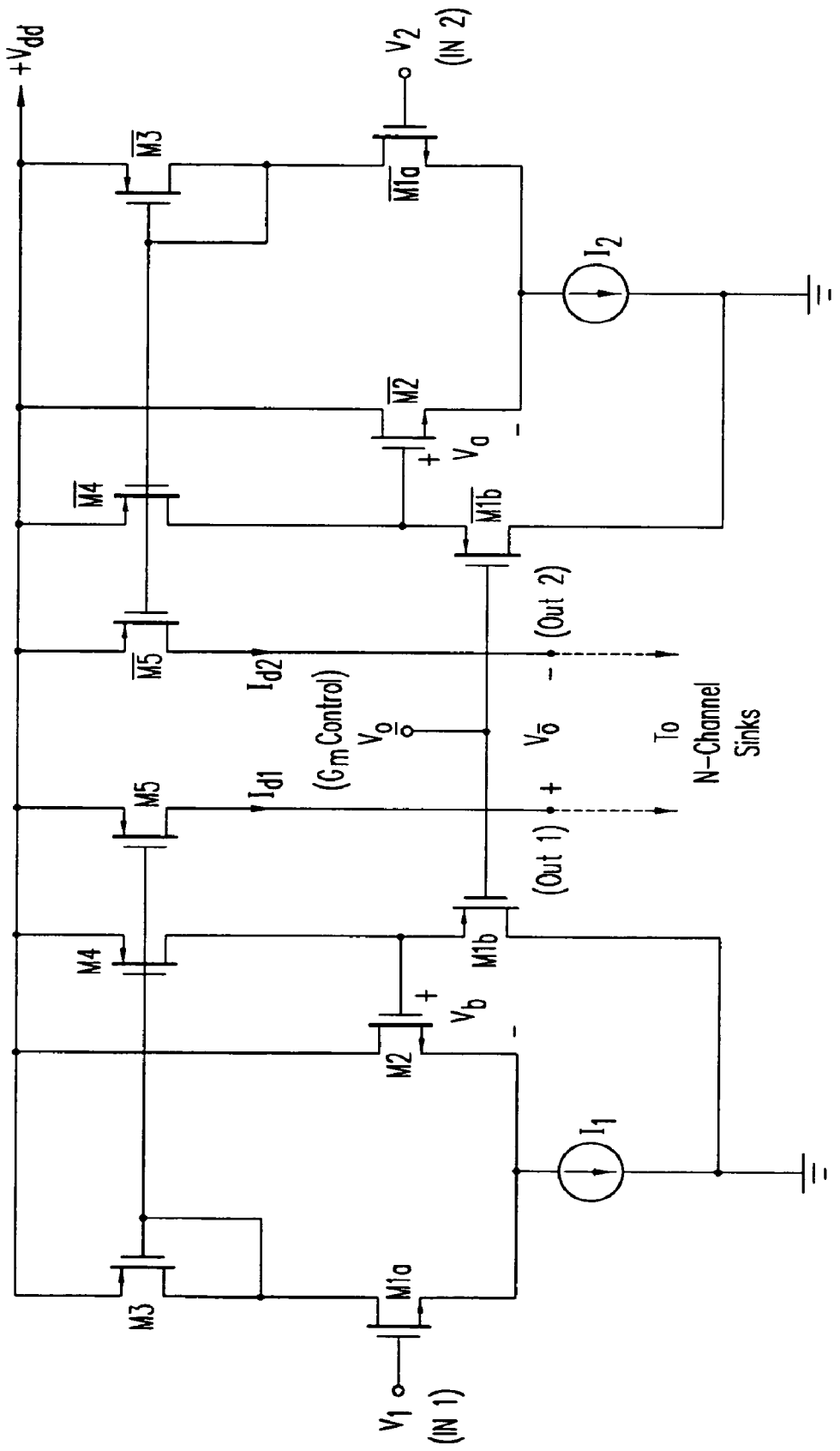
FIG. 8C shows an alternative circuit implementation of the transconductors G1, G2, G3, and G4, utilizing both NMOS and PMOS transistors.

FIG. 8C shows an alternative circuit implementation of the transconductors G1, G2, G3 and G4, utilizing both NMOS and PMOS transistors. This circuit utilizes complementary field effect transistor (COMFET) technology, as indicated by the topology of transistors M1a, M2, and M1b. COMFET technology offers a decreased effective threshold voltage for operation from low-voltage power supplies, and is described in detail in D. Johns and K. Martin, *Analog Integrated Circuit Design*, John Wiley & Sons, Inc. (1997). The input voltages V1 and V2 can be expressed in terms of a common-mode voltage Vcm and a differential voltage Vdi as:

$$V1 = Vcm + Vdi/2;$$

$$V2 = Vcm - Vdi/2.$$

The large-signal output currents Id1 and Id2 can be expressed as:

$$I_{d1} = \frac{K_{ne}}{2}(V_1 - V_Q - V_h)^2$$

$$I_{d2} = \frac{K_{ne}}{2}(V_2 - V_Q - V_h)^2$$

where $K_{ne}$ is the effective $K_n W/L$ transconductance density of the COMFETs formed by the interconnection of NMOS and PMOS transistors, and $V_h$ is the effective and invariably diminished threshold voltage offered by the COMFET interconnection. From the large-signal output signal, the small signal differential output current can be derived as:

$$I_{d1}-I_{d2}=K_{ne}(V_{cm}-V_Q-V_h)V_{di}$$

One of ordinary skill in the art will recognize that various implementations of variable gain amplifiers are known in the art, and may be substituted for the embodiments shown in FIGS. 8, 8A, 8B, and 8C. The disclosed implementations are not meant to limit the scope of the pre-distortion apparatus.

Error Signal Generator

Figure 9:
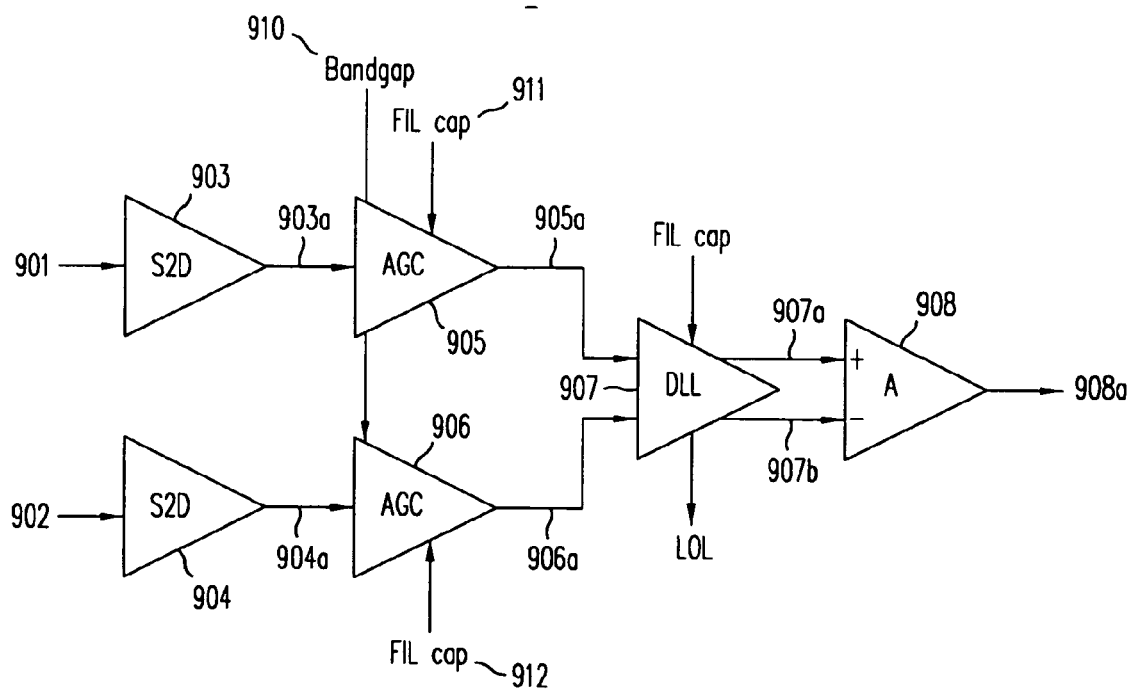
FIG. 9 shows an implementation of the error signal generator block 303 shown in FIG. 4.

FIG. 9 shows an implementation of the error signal generator block 303 shown in FIG. 4. In FIG. 9, two RF signals 901 and 902 can be input to single-to-differential ended converters 903 and 904. The converter 903 can output a differential signal 903a, while the converter 904 can output a differential signal 904a. In an embodiment of the pre-distortion apparatus, the signal 901 can be the buffered reference signal 412a shown in FIG. 4, while signal 902 can be the buffered feedback signal 415a, also shown in FIG. 4.

To commensurately compare between the signals 901 and 902, AGC's 905 and 906 can be provided to adjust the amplitudes of the differential signals 903a and 904a, while the delay-locked loop (DLL) 907 can be provided to adjust the delays of the differential signals. In conjunction with the coarse amplitude adjustment of the scale block 105 in FIG. 4, the AGC 906 can serve to adjust for any gains introduced to the datapath signal 115a before arriving at the error signal generator 303 as the feedback signal 415a, including the power gain introduced by the power amplifier 107. Similarly, the AGC 905 can adjust for any gain introduced to the reference signal 412a. Each automatic gain control circuit 905 or 906 can accept as input control signals a bandgap voltage reference signal 910 and a filtering capacitor 911 or 912 for setting the bandwidth of the AGC. In a preferred embodiment, the capacitor can be chosen such that the bandwidth of the AGC is 200 MHZ.

The output signals 905a and 906a of the AGC's 905 and 906 may be input to a delay-locked loop (DLL) 907. The DLL 907, in conjunction with the coarse delay block 116 in FIG. 1, can serve to synchronize the reference signal 901 with the feedback signal 902 by adjusting for any difference in delays experienced by the signals, including the delay of the power amplifier 107. The signals 907a and 907b may then be input to a differencing amplifier 908, which can generate an error signal e(t) 908 that is a function of the difference between the two signals 907a and 907b. In a preferred embodiment of the differencing amplifier, the amplifier can be a saturating difference amplifier, i.e., the output signal of the amplifier can saturate at a maximum voltage level when the difference between the input signals exceeds a certain voltage, and likewise, the output signal of the amplifier can saturate at a minimum voltage level when the difference between the input signals is below a certain voltage.

Various embodiments of a saturating difference amplifier are possible. One embodiment is an amplifier outputting a function of the difference such as tan h [T·diff], where tan h is the hyperbolic tangent function, T is a chosen gain parameter, and diff is the difference between the input signals 907a and 907b. Such a function may have the advantage of providing an appropriately large error gain T for small differences (diff) to overcome possible offsets in the amplifier, while still limiting (saturating) the gain for large differences to avoid adversely impacting the convergence of the adaptive algorithm performed by the Adapt P block 403.1 or Adapt Q block 403.2 in FIG. 4. In a preferred embodiment, the gain T may range from 30 to 50. The output signal 908a may saturate at plus or minus 1 V. One of ordinary skill in the art will recognize that other implementations of saturating difference amplifiers are possible, including one wherein the output signal comprises a rising linear characteristic that saturates for large enough input signal differences.

The descriptions above are not intended to be exhaustive or to limit the invention to the precise form disclosed. It should be understood that the invention can be practiced with modification and alteration and that the invention be limited only by the claims and the equivalents thereof.

What is claimed is:

1. A pre-distortion apparatus for a power amplifier, the pre-distortion apparatus receiving an input signal and an output signal of the power amplifier, and providing a pre-distorted output signal, the pre-distortion apparatus comprising:
   a memory delay block which provides a delayed signal that is representative of the input signal delayed by a predetermined amount;
   error signal generating circuit that generates an error signal that is representative of a difference between the output signal of the power amplifier and the delayed signal; and
   a pre-distortion circuit comprising:
      an envelope detector which generates an envelope signal that is representative of an envelope of the input signal;
      first and second polynomial function generating circuits responsive to the error signal, each polynomial function generating circuit receiving the envelope signal to provide in-phase and quadrature gain signals each representing a polynomial function of the envelope signal;
      a quadrature-phase shifter receiving the input signal to provide in-phase and quadrature representations of the input signal;
      first and second variable gain amplifiers receiving the in-phase and the quadrature representations of the input signal and the in-phase and quadrature gain signals to provide gain modulated in-phase and quadrature output signals; and
      a summer summing the gain modulated in-phase and quadrature output signals to provide the pre-distorted output signal.

2. The pre-distortion apparatus of claim 1, wherein the pre-determined delay mimics a delay of the power amplifier.

3. The pre-distortion apparatus of claim 1, further comprising an adaptive circuit associated with each polynomial function generating circuit, the adaptive circuit providing a set of coefficients that are used in the associated polynomial function generating circuit to provide the in-phase and quadrature gain signal.

4. The pre-distortion apparatus of claim 3, wherein the adaptive circuit provides the coefficients to minimize the error signal.

5. The pre-distortion apparatus of claim 4, wherein the adaptive circuit comprises a digital signal processor.

6. The pre-distortion apparatus of claim 1, further comprising:
   a second memory circuit providing a first delayed signal and a second delayed signal representative of the input signal delayed by a first predetermined amount and the input signal delayed by a second predetermined amount, respectively;
   a first memory compensation circuit which provides a first memory compensated signal based on the first delayed signal;
   a second memory compensation circuit which provides a second memory compensated signal based on the second delayed signal;
   a second summer that sums the second memory compensated signal with the first memory compensated signal to provide a memory compensated output signal; and
   wherein the memory compensated output signal and the pre-distorted output signal are operatively combined to provide a composite predistorted signal.

7. The pre-distortion apparatus of claim 6, wherein the second memory compensation circuit, comprises:
   first and second polynomial function generating circuits responsive to the error signal, each polynomial function generating circuit receiving an envelope signal that is representative of an envelope of the input signal to provide in-phase and quadrature gain signals each representing a polynomial function of the envelope signal;
   a quadrature-phase shifter receiving the second delayed signal to provide in-phase and quadrature phase-shifted signals;
   first and second mixers mixing the in-phase and quadrature gain signals respectively with the in-phase and quadrature phase-shifted signals to provide in-phase and quadrature mixed signals; and
   a summer summing the in-phase and quadrature mixed signals to provide the second memory compensated signal.

8. The pre-distortion apparatus of claim 1, wherein the memory delay block comprises a delay-locked loop for adjusting the predetermined amount of delay.

9. The pre-distortion apparatus of claim 8, wherein the delay-locked loop receives the input signal and a signal representative of a difference between the error signal and the envelope signal.

10. A method for providing a pre-distortion output signal for input to a power amplifier based on an input signal and an output signal of the power amplifier comprising:
   providing a delayed signal that is representative of the input signal delayed by a predetermined amount;
   providing an error signal that is representative of a difference between the output signal of the power amplifier and the delayed signal; and generating the pre-distortion output signal, comprising:
  generating an envelope signal that is representative of an envelope of the input signal;
  generating first and second polynomial functions responsive to the error signal, the polynomial functions being in-phase and quadrature gain signals each representing a polynomial function of the envelope signal;
  quadrature-phase shifting the input signal to provide in-phase and quadrature representations of the input signal; amplifying the input signal according to the in-phase and quadrature gain signals to provide gain modulated in-phase and quadrature output signals; and
  summing the gain modulated in-phase and quadrature output signals to provide the pre-distorted output signal.

11. The method of claim 10, wherein the pre-determined delay mimics a delay of the power amplifier.

12. The method of claim 10, further comprising adapting each polynomial function by providing a set of coefficients that are used to provide the associated gain signal.

13. The method of claim 12, wherein the coefficients minimize the error signal.

14. The method of claim 13, wherein the coefficients are computed in a digital signal processor.

15. The method of claim 12, further comprising:
  providing a first delayed signal and a second delayed signal representative of the input signal delayed by a first pre-determined amount and the input signal delayed by a second predetermined amount, respectively;
  providing a first memory compensated signal based on the first delayed signal;
  providing a second memory compensated signal based on the second delayed signal; and
  summing the first memory compensated signal and the second memory compensated signal to provide a memory compensated output signal; and
  wherein the memory compensated output signal and the pre-distorted output signal are operatively combined to provide a composite predistorted signal.

16. The method of claim 15, wherein providing the second memory compensated signal comprises:
  based on the error signal and an envelope signal that is representative of an envelope of the input signal, generating in-phase and quadrature gain signals each representing a polynomial function of the envelope signal;
  quadrature-phase shifting the second delayed signal to provide in-phase and quadrature phase-shifted signals;
  mixing the inphase and quadrature gain signals respectively with the inphase and quadrature phase-shifted signals to provide in-phase and quadrature mixed signals; and
  summing the in-phase and quadrature to provide the second memory compensated signal.

17. The method of claim 10, providing the delayed signal comprises using a delay-locked loop to adjust the predetermined amount of delay.

18. The method of claim 17, wherein the delay-locked loop receives the input signal and a signal representative of a difference between the error signal and the envelope signal.

* * * * *